United States Patent
Yoshiba et al.

(10) Patent No.: US 11,482,561 B2
(45) Date of Patent: Oct. 25, 2022

(54) SOLID-STATE IMAGING DEVICE, MANUFACTURING METHOD THEREOF, AND ELECTRONIC APPARATUS

(71) Applicant: SONY SEMICONDUCTOR SOLUTIONS CORPORATION, Kanagawa (JP)

(72) Inventors: Ippei Yoshiba, Kumamoto (JP); Yoichi Ootsuka, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 45 days.

(21) Appl. No.: 16/852,347

(22) Filed: Apr. 17, 2020

(65) Prior Publication Data
US 2020/0243589 A1 Jul. 30, 2020

Related U.S. Application Data

(63) Continuation of application No. 15/122,709, filed as application No. PCT/JP2016/050015 on Jan. 4, 2016, now Pat. No. 10,658,408.

(30) Foreign Application Priority Data

Jan. 13, 2015 (JP) .................................. 2015004098

(51) Int. Cl.
*H01L 31/0232* (2014.01)
*H01L 27/146* (2006.01)
(Continued)

(52) U.S. Cl.
CPC .... *H01L 27/14685* (2013.01); *H01L 27/1464* (2013.01); *H01L 27/14621* (2013.01);
(Continued)

(58) Field of Classification Search
CPC .......... H01L 27/14629; H01L 27/1463; H01L 27/14623; H01L 27/14645; H01L 27/1464;
(Continued)

(56) References Cited

U.S. PATENT DOCUMENTS

2007/0023799 A1* 2/2007 Boettiger .......... H01L 27/14625
257/292
2009/0026563 A1 1/2009 Katsuno et al.
(Continued)

FOREIGN PATENT DOCUMENTS

CN 102396066 3/2012
CN 102983143 3/2013
(Continued)

OTHER PUBLICATIONS

Official Action (with English translation) for China Patent Application No. 20168000828.4, dated Dec. 18, 2020, 18 pages.

*Primary Examiner* — Samuel Park
(74) *Attorney, Agent, or Firm* — Sheridan Ross P.C.

(57) ABSTRACT

The present disclosure relates to a solid-state imaging device, a manufacturing method thereof, and an electronic apparatus, in which both oblique light characteristics and sensitivity can be improved.
The solid-state imaging device includes pixel array unit in which a plurality of pixels is two-dimensionally arranged in a matrix and multi-stage light shielding walls are provided between the pixels. The present disclosure is applicable to, for example, a back-illuminated type solid-state imaging device and the like.

18 Claims, 20 Drawing Sheets

(51) Int. Cl.
  *H04N 5/3745* (2011.01)
  *H04N 5/369* (2011.01)
  *H04N 9/04* (2006.01)
  *H04N 5/365* (2011.01)
  *H04N 5/374* (2011.01)
  *H04N 5/378* (2011.01)
  *H04N 5/232* (2006.01)

(52) U.S. Cl.
  CPC .. *H01L 27/14623* (2013.01); *H01L 27/14627* (2013.01); *H01L 27/14645* (2013.01); *H04N 5/365* (2013.01); *H04N 5/36961* (2018.08); *H04N 5/374* (2013.01); *H04N 5/378* (2013.01); *H04N 5/3745* (2013.01); *H04N 9/04557* (2018.08); *H01L 27/14634* (2013.01); *H04N 5/232122* (2018.08)

(58) Field of Classification Search
  CPC ......... H01L 27/14621; H01L 27/14627; H01L 27/14687; H01L 27/14609; H01L 25/167; H01L 27/3227; H01L 31/02024; H01L 31/0203; H01L 31/0284; H01L 31/1032; H01L 31/107; H01L 27/14643–14663; H01L 27/146–14893; H01L 27/307; H01L 27/14685; H01L 27/14634; H04N 5/365; H04N 5/374–37457; H04N 5/335–378; H04N 5/36961; H04N 9/04557; H04N 5/232122; H04N 5/3696; H04N 5/357
  See application file for complete search history.

(56) References Cited

U.S. PATENT DOCUMENTS

| | | | |
|---|---|---|---|
| 2009/0027541 A1* | 1/2009 | Takayama | H01L 27/14627 348/340 |
| 2015/0008554 A1 | 1/2015 | Akiyama | |

FOREIGN PATENT DOCUMENTS

| | | |
|---|---|---|
| CN | 103258829 | 8/2013 |
| JP | 2001237404 A | 8/2001 |
| JP | 2005294647 A | 10/2005 |
| JP | 2009021415 A | 1/2009 |
| JP | 2010267680 A | 11/2010 |
| JP | 2011176715 A | 9/2011 |
| JP | 2011-210981 | 10/2011 |
| JP | 2011-258728 | 12/2011 |
| JP | 2013070030 A | 4/2013 |
| JP | 2013254763 A | 12/2013 |
| JP | 2014089432 A | 5/2014 |
| JP | 2014-156378 | 8/2014 |
| JP | 2015015296 A | 1/2015 |
| WO | WO 2013/128925 | 9/2013 |
| WO | WO-2013128925 A1 * | 9/2013 ........ H01L 27/14623 |
| WO | WO-2014141991 A | 9/2014 |

* cited by examiner

SOLID-STATE IMAGING DEVICE, MANUFACTURING METHOD THEREOF, AND ELECTRONIC APPARATUS

CROSS REFERENCE TO RELATED APPLICATIONS

This application is a U.S. Continuation of Ser. No. 15/122,709 filed Aug. 31, 2016 which is a national stage application under 35 U.S.C. 371 and claims the benefit of PCT Application No. PCT/JP2016/050015 having an international filing date of 4 Jan. 2016, which designed the United States, which PCT application claimed the benefit of Japanese Patent Application No. 2015-004098 filed 13 Jan. 2015, the disclosures of which are incorporated herein by reference in their entirety.

TECHNICAL FIELD

The present disclosure relates to a solid-state imaging device, a manufacturing method thereof, and an electronic apparatus, and particularly relates to a solid-state imaging device, a manufacturing method thereof, and an electronic apparatus in which both oblique light characteristics and sensitivity can be improved.

BACKGROUND ART

As a CMOS solid-state imaging device, a front-illuminated type and a back-illuminated type are known. In the front-illuminated type CMOS solid-state imaging device, light is made to enter a front surface side of a substrate surface formed with a multi-layer wiring layer and a pixel transistor by setting this substrate front surface as a light receiving surface. In the back-illuminated type CMOS solid-state imaging device, light is made to enter a back surface side that is an opposite side of the substrate front surface formed with the multi-layer wiring layer and the pixel transistor by setting the back surface of the substrate as a light receiving surface (refer to Patent Document 1, for example).

In the back-illuminated type, the light is made to enter a photodiode without restriction of the multi-layer wiring layer. Therefore, in the case of comparing both types under the condition of a same pixel pitch, an opening of the photodiode can be formed wider in the back-illuminated type and sensitivity higher than the front-illuminated type can be achieved. Furthermore, since the back-illuminated type has no wiring layer on the light receiving surface side, a height of a light condensing structure can be formed lower than the front-illuminated type, and excellent oblique light characteristics can be achieved (refer to Non-Patent Document 1, for example).

CITATION LIST

Patent Document

Patent Document 1: Japanese Patent Application Laid-Open No. 2011-135101

Non-Patent Document

Non-Patent Document 1: The latest trend in CMOS image sensors-high performance, versatile functions, and wide application thereof (2007 CMC Publishing Co. Ltd.) P 39-40, S. Iwabuchi, et al. ISSCC Dig. Tech. Papers. pp. 302-303, (2006)

SUMMARY OF THE INVENTION

Problems to be Solved by the Invention

However, for example, in an image sensor used in a digital single lens camera, light having a larger angle than a main beam angle of an attached lens tends to be unnecessary light such as a reflection light inside a camera casing, and in the case where oblique light characteristics are high more than necessity, the unnecessary light may be detected and an image may be deteriorated. In the case of adjusting the oblique light characteristics in a state that a height is lowered, it is considered to adjust a width of a light shielding film between pixels, but since a distance between an on-chip lens and a light shielding film is close, vignetting may be caused at an opening of the light shielding film and sensitivity may be deteriorated. In the case of intending to have sensitivity only for light in a necessary angle range, adjustment can be made with the width of the light shielding film between the pixels in a state that a height is increased and a focus point is adjusted to a light receiving surface (opening of the light shielding film) to a some extent. However, in this case, there may be a concern that color mixture may be caused by oblique light from between the on-chip lens and the light shielding film.

The present disclosure is made in consideration of the above-described situations, and directed to achieving improvement in both oblique light characteristics and sensitivity in a back-illuminated type solid-state imaging device.

Solutions to Problems

A solid-state imaging device according to a first aspect of the present disclosure includes a pixel array unit in which a plurality of pixels is two-dimensionally arranged in a matrix and multi-stage light shielding walls are provided between the pixels.

In a manufacturing method of a solid-state imaging device according to a second aspect of the present disclosure, multi-stage light shielding walls are formed between pixels at the time of forming a pixel array unit in which a plurality of pixels is two-dimensionally arranged in a matrix.

An electronic apparatus according to a third aspect of the present disclosure includes a solid-state imaging device including a pixel array unit in which a plurality of pixels is two-dimensionally arranged in a matrix and multi-stage light shielding walls are provided between the pixels.

According to the first to third aspects of the present disclosure, the multi-stage light shielding walls are formed between the pixels in the pixel array unit in which the plurality of pixels is two-dimensionally arranged in a matrix.

The solid-state imaging device and the electronic apparatus may be independent devices or may also be modules incorporated in a different device.

Effects of the Invention

According to the first to third aspects of the present disclosure, both oblique light characteristics and sensitivity can be improved.

Note that effects recited herein are not necessarily limited thereto and may also be any of those recited in the present disclosure.

MODE FOR CARRYING OUT THE INVENTION

Modes for carrying out the present disclosure (hereinafter referred to as embodiments) will be described below. Note that the description will be provided in the following order.

1. Exemplary Schematic Configuration of Solid-State Imaging Device
2. First Embodiment of Pixel (Exemplary Structure Including No Inner Lens)
3. Manufacturing Method of Pixel According to First Embodiment
4. Second Embodiment of Pixel (First Exemplary Structure Including Inner Lens)
5. Third Embodiment of Pixel (Second Exemplary Structure Including Inner Lens)
6. Fourth Embodiment of Pixel (Third Exemplary Structure Including Inner Lens)
7. Pixel Structure of Phase Difference Pixel
8. Forming Method of Inner Lens
9. Shape of On-Chip Lens
10. Light Shielding Structure in OPB Area
11. Exemplary Substrate Configuration of Solid-State Imaging Device 12. Exemplary Application to Electronic Apparatus 1. Exemplary Schematic Configuration of Solid-State Imaging Device FIG. 1 is a diagram illustrating a schematic configuration of a solid-state imaging device according to the present disclosure.

Figure 1:
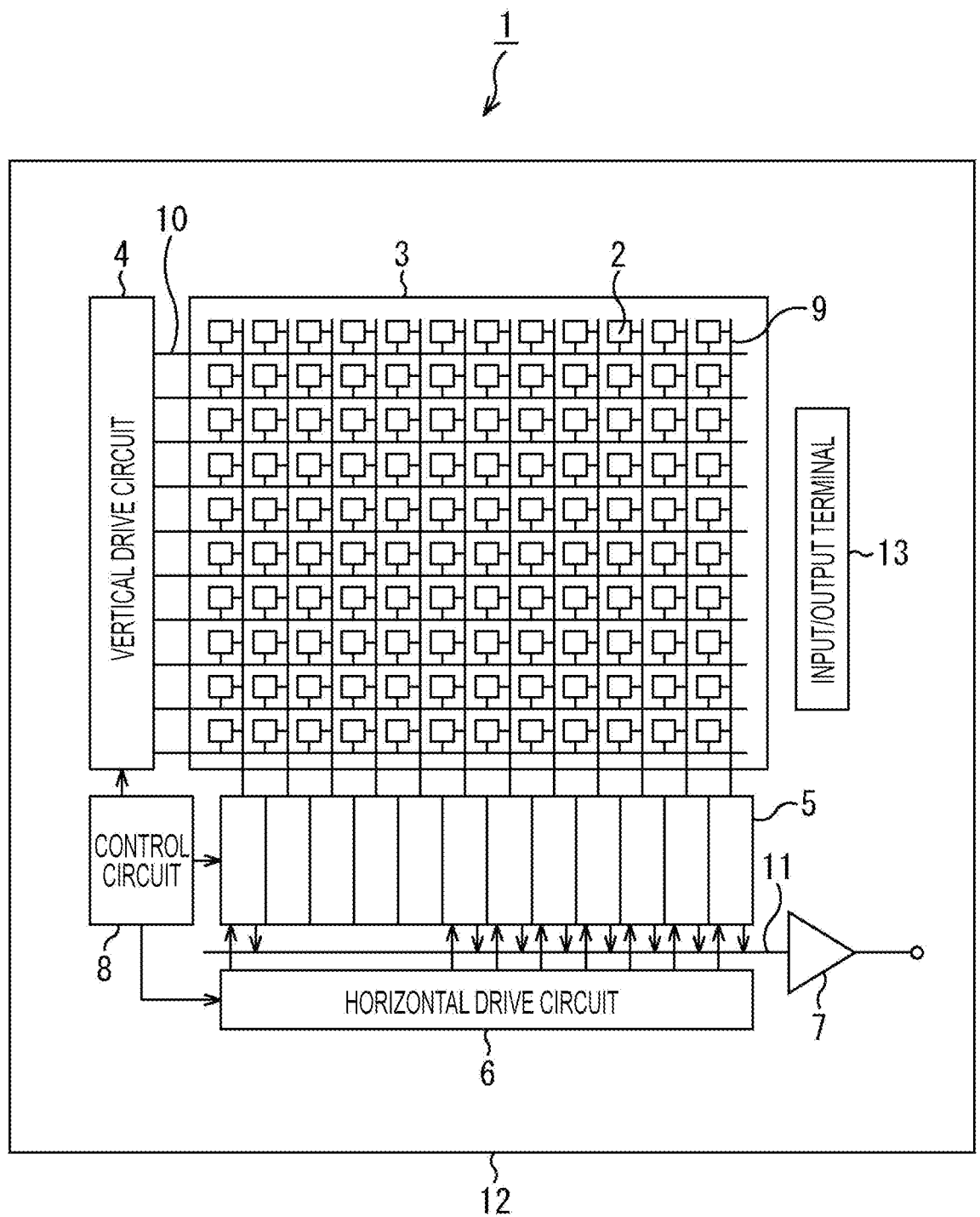
FIG. 1 is a diagram illustrating a schematic configuration of a solid-state imaging device according to the present disclosure.

A solid-state imaging device 1 in FIG. 1 is formed by including a pixel array unit 3 and a peripheral circuit unit in the periphery thereof. In the pixel array unit 3, a plurality of pixels 2 is two-dimensionally arranged in a matrix on a semiconductor substrate 12 using silicon (Si) as a semiconductor, for example. The peripheral circuit unit includes a vertical drive circuit 4, a column signal processing circuit 5, a horizontal drive circuit 6, an output circuit 7, a control circuit 8, and the like.

The pixel 2 is formed by including a plurality of pixel transistors and a photodiode as a photoelectric conversion element. The plurality of pixel transistors is formed of, for example, four MOS transistors including a transfer transistor, a selection transistor, a reset transistor, and an amplification transistor.

Furthermore, the pixel 2 can have a shared pixel structure. The shared pixel structure is formed of a plurality of photodiodes, a plurality of transfer transistors, one shared floating diffusion (floating diffusion region), and another pixel transistor shared in each. More specifically, in the shared pixel structure, the photodiodes and the transfer transistors constituting a plurality of unit pixels are formed in a manner sharing another pixel transistor in each.

The control circuit 8 receives an input clock and data that commands an operation mode and the like, and also outputs data such as internal information of the solid-state imaging device 1. More specifically, the control circuit 8 generates a clock signal and a control signal to be reference of operation of the vertical drive circuit 4, column signal processing circuit 5, horizontal drive circuit 6, and the like based on a vertical synchronization signal, a horizontal synchronization signal, and a master clock. Furthermore, the control circuit 8 outputs the generated clock signal and control signal to the vertical drive circuit 4, column signal processing circuit 5, horizontal drive circuit 6, and the like.

The vertical drive circuit 4 is formed of, for example, a shift register and selects a predetermined pixel drive wire 10, supplies a pulse to the selected pixel drive wire 10 in order to drive a pixel 2, and drives pixels 2 in row units. More specifically, the vertical drive circuit 4 selectively and sequentially scans each of the pixels 2 in the pixel array unit 3 in the row units in a vertical direction, and supplies the column signal processing circuit 5 with a pixel signal via a vertical signal line 9 based on signal charge generated in a photoelectric conversion unit in each of the pixel 2 in accordance with a light receiving amount.

The column signal processing circuit 5 is arranged, for example, per column of the pixels 2 and adapted to apply, per pixel column, signal processing such as noise removal for a signal output from the pixels 2 in one row. The column signal processing circuit 5 performs signal processing such as AD conversion and correlated double sampling (CDS) in order to remove fixed-pattern noise unique to a pixel.

The horizontal drive circuit 6 is formed of, for example, a shift register, and sequentially selects each of column signal processing circuits 5 and causes each of column signal processing circuits 5 to output a pixel signal to a horizontal signal line 11 by sequentially outputting horizontal scanning pulses.

The output circuit 7 applies signal processing to the signal sequentially supplied from each of the column signal processing circuits 5 via the horizontal signal line 11, and outputs the signal subjected to the signal processing. The output circuit 7 may perform, for example, only buffering or may perform black level adjustment, correction of column variation, various kinds of digital signal processing, and the like. The input/output terminal 13 exchanges signals with the outside.

The solid-state imaging device 1 thus configured is a CMOS image sensor of a so-called AD system in which the column signal processing circuit 5 adapted to perform the CDS processing and AD conversion processing is arranged per pixel column.

2. First Embodiment of Pixel

<Cross-Sectional View of Structure of Pixel>

Figure 2:
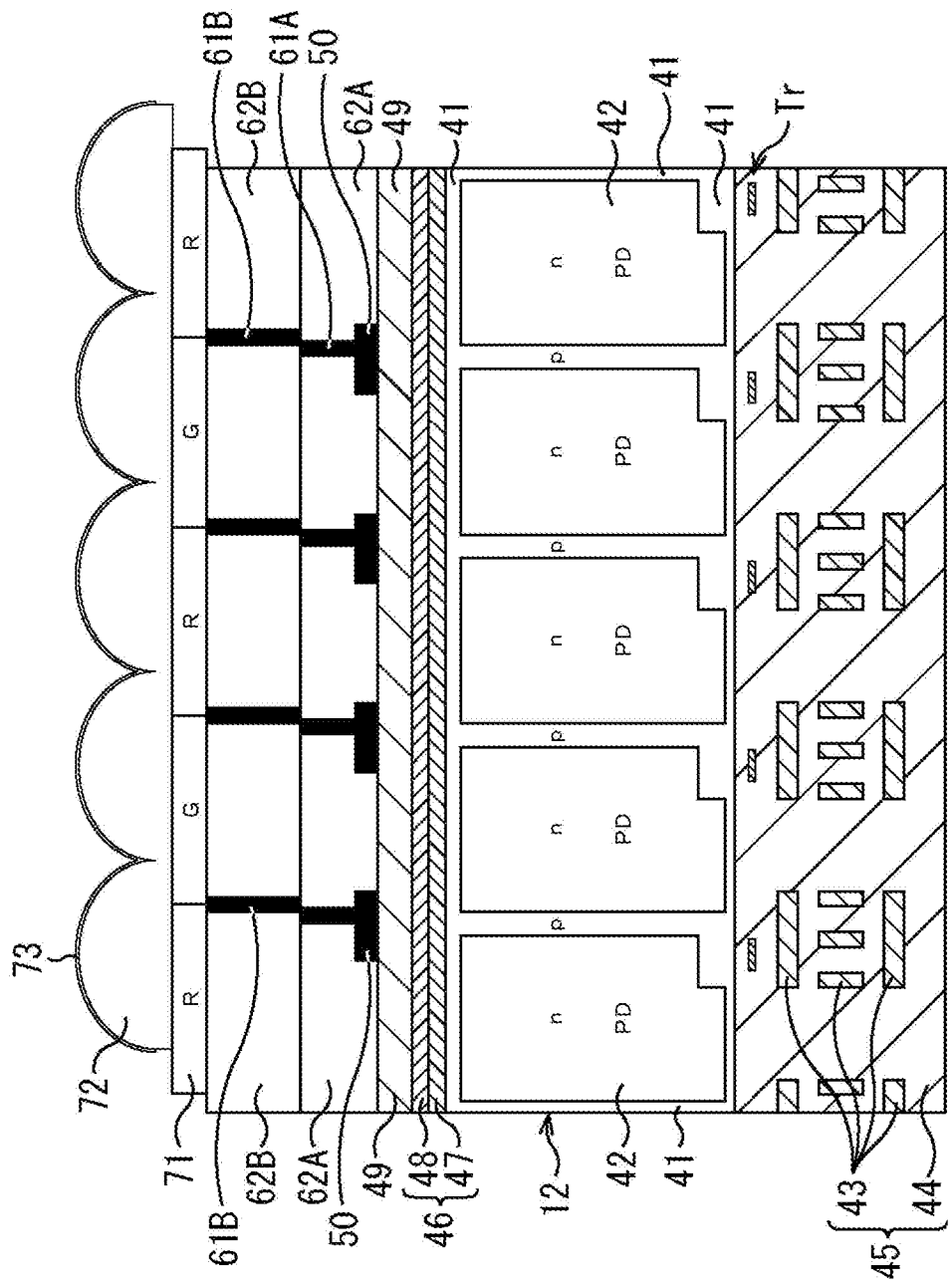
FIG. 2 is a cross-sectional view illustrating a structure of a pixel according to a first embodiment.

FIG. 2 is a cross-sectional view illustrating a structure of a pixel 2 according to a first embodiment.

In a solid-state imaging device 1, a photodiode PD is formed per pixel by forming an n-type (second conductivity type) semiconductor region 42 per pixel 2 in a p-type (first conductive type) semiconductor region 41 of the semiconductor substrate 12, for example. The p-type semiconductor region 41 facing both of the front and back surfaces of the semiconductor substrate 12 also functions as a positive hole charge accumulating region in order to suppress dark current.

The front surface side of the semiconductor substrate 12 (lower side in the drawing) is formed with: a plurality of pixel transistors Tr adapted to read charge accumulated in a photodiode PD; and a multi-layer wiring layer 45 including a plurality of wiring layers 43 and an interlayer dielectric film 44.

Since light does not enter the multi-layer wiring layer 45 side of the semiconductor substrate 12, layout of the wiring layer 43 can be freely set without restriction.

An insulation layer 46 is formed on a boundary surface on the back surface side of the semiconductor substrate 12 (upper side in the drawing). In the example in FIG. 2, the insulation layer 46 is formed of a plurality of layers having different refraction indexes, for example, two layers of a hafnium oxide (HfO2) film 48 and a silicon oxide film 47, and the insulation layer 46 optically functions as a reflection preventing film.

A flattened film 49 is formed on an upper surface of the insulation layer 46, and an inter-pixel light shielding film 50 is formed at a pixel boundary portion on the flattened film 49. The inter-pixel light shielding film 50 is needed to be at least a material that shields light, and preferably the inter-pixel light shielding film is formed of a film of a metal such as aluminum (Al), tungsten (W), or copper (Cu) as a material that has a high light shielding property and can be accurately processed by fine processing such as etching.

Figure 3:
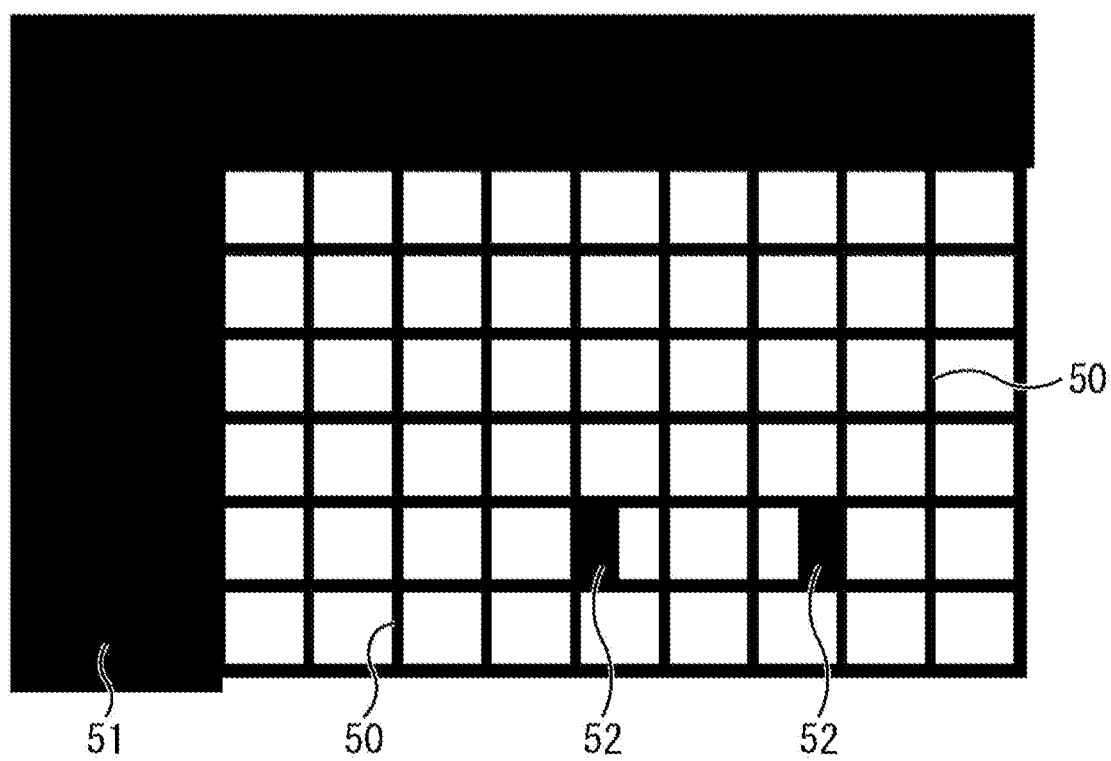
FIG. 3 is a plan view illustrating a light shielding film.

As illustrated in FIG. 3, the inter-pixel light shielding film 50 is the same layer as an optical black (OPB) forming film 51 outside a pixel effective area and a pupil division light shielding film 52 of a phase difference pixel 2P (FIG. 11), and can be formed together at the same time. The inter-pixel light shielding film 50 suppresses color mixture between pixels and light of a flare component incident at an unexpected angle. The OPB forming film 51 forms, by covering the outside of the pixel effective area, an OPB clamp region adapted to detect a black level to be reference of output in the dark. The pupil division light shielding film 52 divides light from different eye points in the phase difference pixel 2P.

For example, as illustrated in FIG. 3, there are two kinds of the phase difference pixels 2P formed by the pupil division light shielding film 52: a type A in which a left half portion of a light receiving surface of a photodiode PD is opened; and a type B in which a right half portion thereof is opened. A pair of these two kinds of phase difference pixels is arranged at a predetermined position of the pixel array unit 3. Between a pixel signal from the type A and a pixel signal of the type B, image displacement is caused because formed positions of the opening portions are different. From this image displacement, a defocus amount is calculated by calculating a phase displacement amount, and auto-focus can be achieved by adjusting (moving) a photographing lens.

Needless to mention, there is no need to form the inter-pixel light shielding film 50, OPB forming film 51, and pupil division light shielding film 52 at the same time, and the films may also be formed individually. Furthermore, for example, in the case of prioritizing improvement of sensitivity by suppressing color mixture and flare, a width of a grid in the inter-pixel light shielding film 50 may be formed shorter.

Referring back to the description for FIG. 2, layers of the light shielding walls 61 and the flattened films 62 are formed in multiple stages on the inter-pixel light shielding film 50 and the insulation layer 46. More specifically, in a portion on the inter-pixel light shielding film 50, a first light shielding wall 61A is formed and also a first flattened film 62A is formed between the first light shielding walls 61A. Furthermore, on the first light shielding wall 61A and the first flattened film 62A, a second light shielding wall 61B and a second flattened film 62B are formed.

On upper surfaces of the second light shielding wall 61B and second flattened film 62B, a color filter 71 is formed per pixel. As an array of the color filter 71, respective colors of red (R), green (G), and blue (B) are arranged in the Bayer array, for example, but arrangement may also be based on a different arraying method.

The first light shielding walls 61A and the second light shielding walls 61B are formed in a grid at pixel boundary portions with respect to a plane direction same as the inter-pixel light shielding film 50 illustrated in FIG. 3.

The second light shielding wall 61B located on a topmost stage out of the multiple stages may have a shape projecting to a layer of the color filter 71 from the second flattened film 62B in order to provide light shielding between the adjacent color filters 71.

An on-chip lens 72 is formed on the color filter 71 per pixel. As a material of this on-chip lens 72, for example, organic materials such as a styrene-based resin, an acryl-based resin, a styrene-acrylic copolymer resin, and a siloxane-based resin may be applied. A refraction index of the styrene-based resin is about 1.6, and a refraction index of the acryl-based resin is about 1.5. A refraction index of the styrene-acrylic copolymer resin is about 1.5 to 1.6, and a refraction index of the siloxane-based resin is about 1.45.

Additionally, as the organic material, an organic-inorganic hybrid material obtained by dispersing TiO fine particles into the above-described resins and a polyamide resin may also be utilized.

Additionally, as the material of this on-chip lens 72, for example, inorganic materials such as SiN and SiON may also be used. A refraction index of the SiN is about 1.9 to 2.0, and a refraction index of SiON is about 1.45 to 1.9.

A surface of the on-chip lens 72 is covered with a reflection preventing film 73.

In the drawing, the first light shielding wall 61A, second light shielding wall 61B, color filter 71, and on-chip lens 72 formed on an upper side of the inter-pixel light shielding film 50 are formed so as to perform pupil correction.

More specifically, since an incident angle of a main beam of incident light from an optical lens (not illustrated) becomes zero degree at a center portion of the pixel array unit 3, there is no need to perform pupil correction, and a center of a photodiode PD coincides with centers of the color filter 71 and on-chip lens 72.

On the other hand, since the incident angle of the main beam of the incident light from the optical lens has a predetermined angle in accordance with design in a peripheral portion (outer peripheral portion) of the pixel array unit 3, pupil correction is performed. More specifically, as illustrated in FIG. 2, the centers of the color filter 71 and on-chip lens 72 are arranged in a manner deviated to the center side of the pixel array unit 3 from the center of the photodiode PD. A deviation amount between the center position of the photodiode PD and the center positions of the color filter 71 and on-chip lens 72 becomes larger as a position approaches to the outer periphery of the pixel array unit 3.

Additionally, in accordance with such deviation of the color filter 71 and on-chip lens 72, positions of the first light shielding wall 61A and second light shielding wall 61B are also deviated to the center side as a position approaches to the outer periphery of the pixel array unit 3.

Meanwhile, the pixel structure illustrated in FIG. 2 is the example in which the light shielding walls 61 are formed in the two stages including the first light shielding wall 61A and the second light shielding wall 61B, but the light shielding walls can be formed in optional number of stages (Q stage (Q>2). In the following, a layer formed with the light shielding wall 61 will be also referred to as a light shielding wall layer.

As for pupil correction of the light shielding wall 61, loss of sensitivity in the peripheral portion (angle field edge) of the pixel array unit 3 can be minimized by applying an optimal correction amount at a height of each light shielding wall 61 in a certain image height.

In the certain image height, the more increased the number of stages of the light shielding wall 61 is, in other words, the closer to the color filter 71 a position approaches to, the larger a pupil correction amount is. However, a pupil correction amount at the light shielding wall 61 in the topmost stage is equal to or less than a pupil correction amount of the color filter 71.

Further, as for the pupil correction amount of the color filter 71, when the correction amount is large, there is a concern that color mixture may be caused by the color filter 71 of own pixel entering a region surrounded by light shielding walls 61 of adjacent pixels. Therefore, the pupil correction amount of the color filter 71 is set within a range from a correction amount same as the light shielding wall 61 in the topmost stage closest to the color filter 71 to a correction amount obtained by adding a half width of the light shielding wall 61 of the topmost stage to the pupil correction amount of the light shielding wall 61 of the topmost stage. More specifically, provided that the pupil correction amount and the width of the light shielding wall 61 of the topmost stage are C and X, the color filter 71 is formed such that the pupil correction amount D of the color filter 71 becomes $C \leq D \leq C + X/2$.

Also, the pupil correction amount becomes larger in the following order: inter-pixel light shielding film 50 light shielding wall 61 of first stage light shielding wall 61 of second stage . . . light shielding wall in topmost stage 61 color filter 71 on-chip lens 72.

Furthermore, in the case where one stage of the light shielding wall 61 has the same height and a material of the flattened film 62 is the same, preferably, the pupil correction amount of the light shielding wall 61 is proportional to a height of layer where the light shielding wall 61 is located.

Additionally, when strong light such as sun light enters an angle field edge, there is a concern of having influence of color mixture such as flare because the light enters from a direction different from normal light incident from a lens due to reflection light inside a camera casing (the different direction may be a direction opposite to a pupil correction direction). Therefore, in order to handle the incident light from various directions, preferably, the pupil correction of the color filter 71 is the same correction amount as the light shielding wall 61 in the topmost stage below the color filter 71.

Since the pupil correction amount is large at the angle field edge, a light shielding wall 61 of an upper stage does not overlap at all with a light shielding wall 61 of a stage immediately below, and the light shielding wall 61 of the upper stage is in a state stepping away from the light shielding wall 61 of the stage immediately below. In this case, there is a concern that arcing may occur at the time of etching the flattened film 62 when pattern processing is applied to the light shielding wall 61. However, pupil correction amounts of the light shielding walls 61 on the respective stages become almost equal in a center of an image height, and the wall of the lower stage is surely connected and the connected upper and lower light shielding walls 61 have electrically same potential. Therefore, there is no concern of arcing.

Furthermore, in etching the flattened film 62 at the time of applying the pattern processing to the light shielding wall 61, forward tapering processing is applied. In the forward tapering processing, an area in the plane direction of the light shielding wall 61 is formed larger as a position approaches the upper side from a bottom surface. Therefore, the small bottom surface of the light shielding wall 61 of the upper stage can be supported by an upper surface of the light shielding wall 61 of the lower stage having the larger area than the small bottom surface. As a result, the light shielding wall 61 of the upper stage can reduce a risk of stepping away from the light shielding wall 61 of the stage immediately below, and also a metal embedding property is improved and a process margin can be secured as well.

The pixel structure of the solid-state imaging device 1 is formed as described above, and the solid-state imaging device 1 is a back-illuminated type MOS solid-state imaging device in which light is incident from the back surface side that is an opposite side of the front surface side of the semiconductor substrate 12 where the pixel transistors Tr are formed.

Furthermore, the solid-state imaging device 1 has the structure in which at least two-stage light shielding walls 61 adapted to block incidence of oblique light from adjacent pixels are provided separately from the inter-pixel light shielding film 50.

3. Manufacturing Method of Pixel According to First Embodiment

Next, a manufacturing method of a pixel 2 according to the above-described first embodiment will be described with reference to FIGS. 4 to 6.

Figure 4:
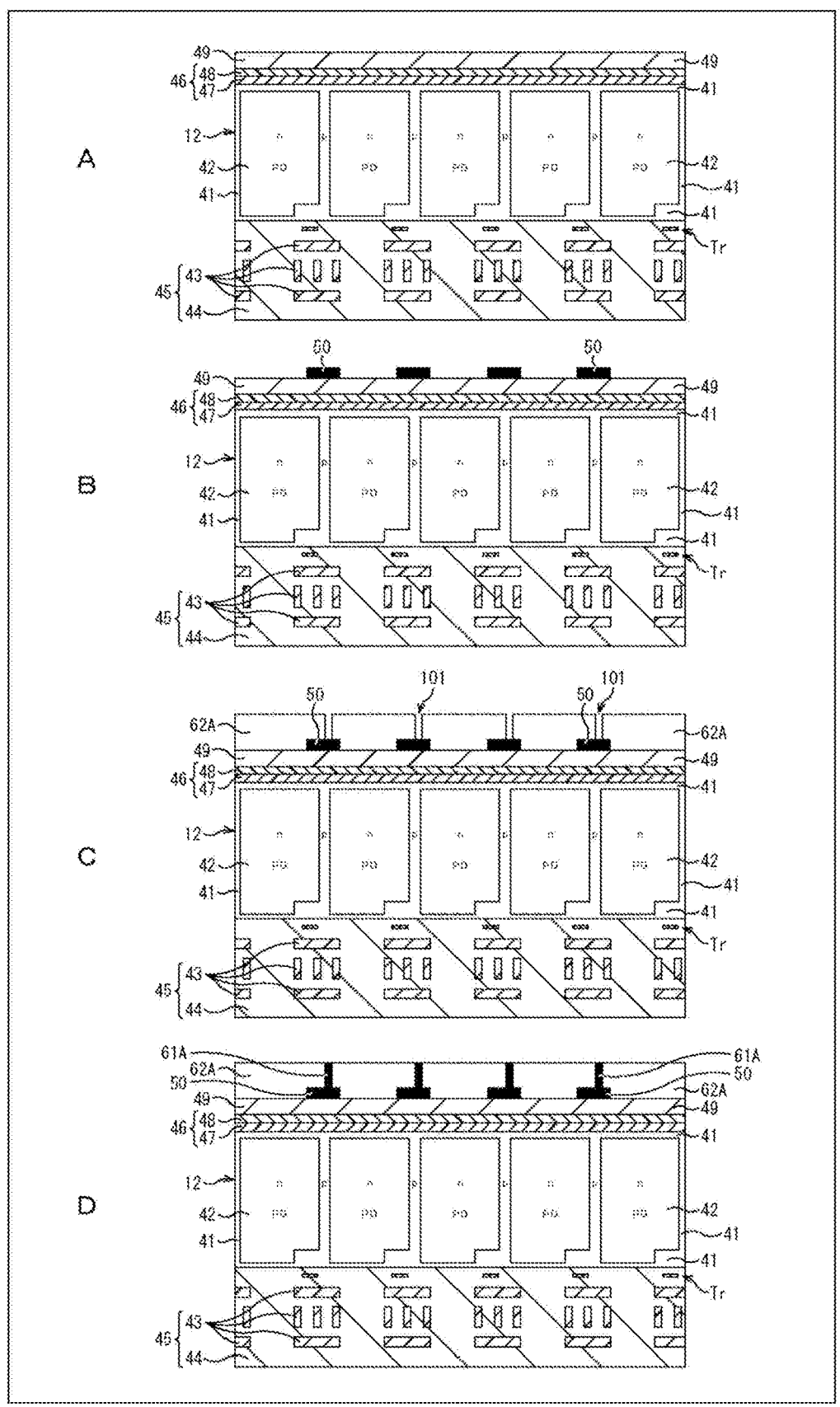
FIG. 4 is an explanatory diagram for a manufacturing method of the pixel according to the first embodiment.

First, as illustrated in A of FIG. 4, an n-type semiconductor region 42 is formed on a p-type semiconductor region 41 per pixel 2 on the semiconductor substrate 12, thereby forming a photodiode PD per pixel. The plurality of pixel transistors Tr adapted to, for example, read charge accumulated in the photodiode PD, and the multi-layer wiring layer 45 including the plurality of wiring layers 43 and the interlayer dielectric film 44 are formed on the front surface side of the semiconductor substrate 12 (lower side in the drawing). Additionally, the insulation layer 46 and the flattened film 49 are formed on a back surface side of the semiconductor substrate 12 (upper side in the drawing). Up to this process, the pixel can be formed by a method same as the case of forming a general back-illuminated type solid-state imaging device.

Next, as illustrated in B of FIG. 4, the inter-pixel light shielding film 50 is formed of a metallic material such as aluminum (Al), tungsten (W), or copper (Cu) in the pixel boundary portion on the flattened film 49.

Next, a film of an inorganic material such as SiO2 to be the flattened film 62A is formed, and then flattening is performed by chemical mechanical polishing (CMP) or the like, thereby forming a flattened layer on an upper surface of the inter-pixel light shielding film 50. After that, as illustrated in C of FIG. 4, etching processing is applied to a predetermined portion on the inter-pixel light shielding film 50, thereby forming an opening portion 101 where a portion to be formed with the first light shielding wall 61A is opened in the flattened film 62A.

Subsequently, the metallic material such as tungsten or copper is embedded in the opening portion 101, and then chemical mechanical polishing (CMP) is applied to the entire surface, thereby forming the first light shielding wall 61A as illustrated in D of FIG. 4.

Meanwhile, when the metallic material is embedded in the opening portion 101, for example, TiN is formed on an inner peripheral surface as an adhesion layer. Here, an effect of reducing unnecessary light by reducing reflection can be expected by this adhesion layer.

Furthermore, in the case of using aluminum as the metallic material of the first light shielding wall 61A, the flattened film 62A can be formed after forming the first light shielding wall 61A first. More specifically, first of all, a film of aluminum to be the first light shielding wall 61A is formed on the entire surface up to a desired height, and the first light shielding wall 61A is formed by performing patterning by lithography. After that, the inorganic material such as SiO2 to be the flattened film 62A is embedded between the formed first light shielding walls 61A, and the entire surface is flattened by the CMP, thereby forming the state illustrated in D of FIG. 4.

The first light shielding wall 61A uses the inter-pixel light shielding film 50 as a seat at the time of etching processing, but even in the case of not forming the inter-pixel light shielding film 50 due to prioritization of sensitivity, the first light shielding wall 61A can be formed by fixing the time to perform the etching processing at the time of patterning the first light shielding wall 61A or by using an insulation layer on the photodiode PD, such as SiN, as a stopper to stop etching.

By repeating the processes described with reference to C of FIG. 4 and D of FIG. 4, a second light shielding wall 61B and a second flattened film 62B of a second stage are formed as illustrated in A of FIG. 5. In the case of forming three or more stages of the light shielding walls 61 and flattened films 62, the same processes are repeated. Meanwhile, due to restriction of coverage of barrier metal and a resist film thickness, preferably, the height of one-stage light shielding wall 61 is 2 um or less.

Figure 5:
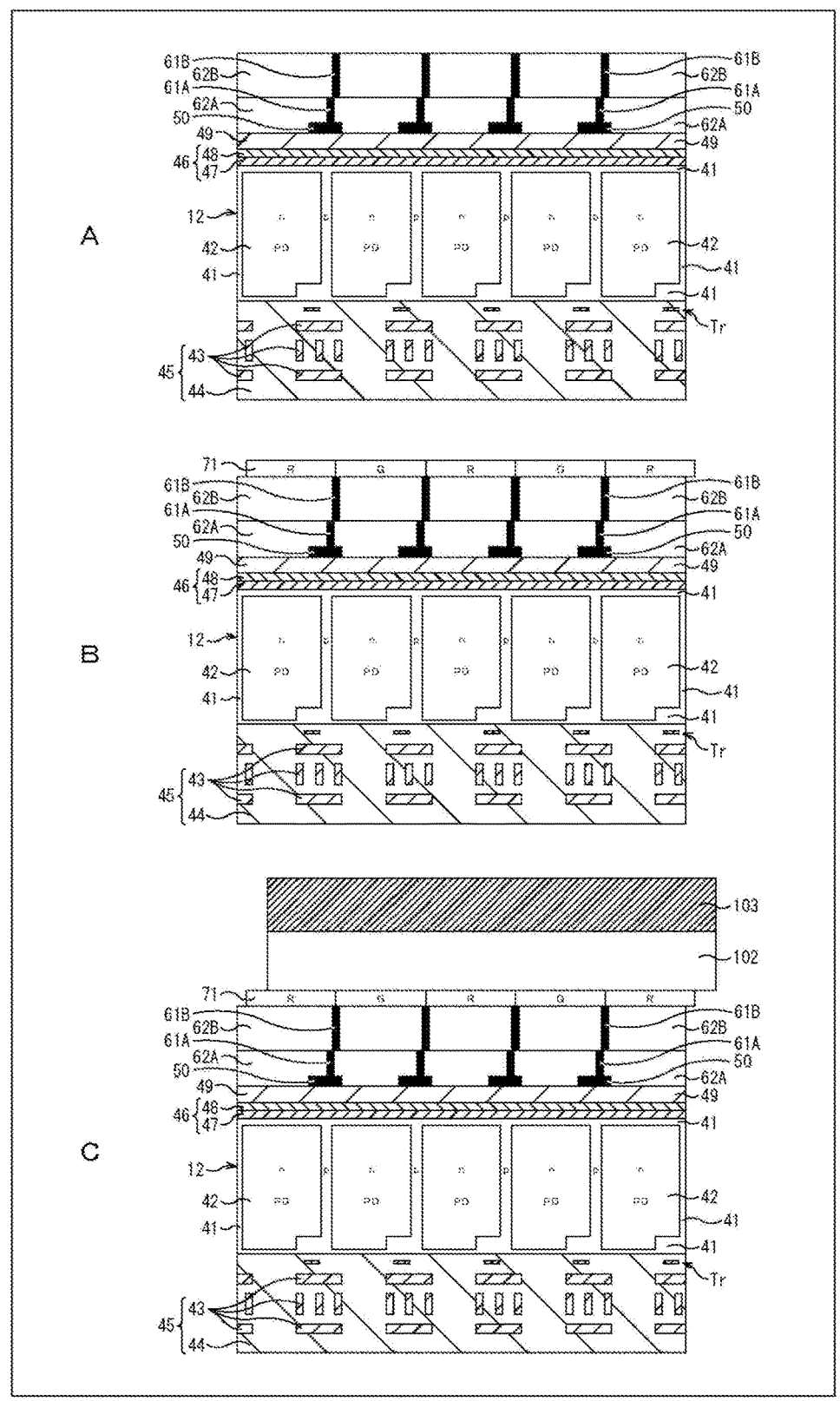
FIG. 5 is an explanatory diagram for the manufacturing method of the pixel according to the first embodiment.

Next, as illustrated in B of FIG. 5, the color filter 71 is formed on the second light shielding wall 61B and the second flattened film 62B of the second stage and by rotationally applying a photosensitive resin containing pigments such as coloring matters and dye. Preferably, clearance between the color filter 71 and the second light shielding wall 61B of the topmost stage is formed small as much as possible in the viewpoint of resistance against color mixture at the time of having a large incident angle.

In the case of forming the second light shielding wall 61B to be the topmost stage in a manner projecting to the layer of the color filter 71 from the second flattened film 62B in order to shield light between the adjacent color filters 71, the film forming by embedding the metallic material to be the second light shielding wall 61B is performed, and then etching removal is performed for only the opening portion of the pixel by the lithography such that the metallic material remains at the upper portion of the light shielding wall between the pixels. Consequently, the projecting portion of the second light shielding wall 61B is formed and the color filter 71 is embedded between the second light shielding walls 61B.

Next, as illustrated in C of FIG. 5, an on-chip lens material 102 and a photoresist 103 are formed on the color filter 71. As the on-chip lens material 102, a resin-based organic material, an inorganic material like SiN, an organic/inorganic hybrid material, or the like can be used as described above. Furthermore, for the photoresist 103, a photosensitive material mainly containing a novolac resin can be used.

Figure 6:
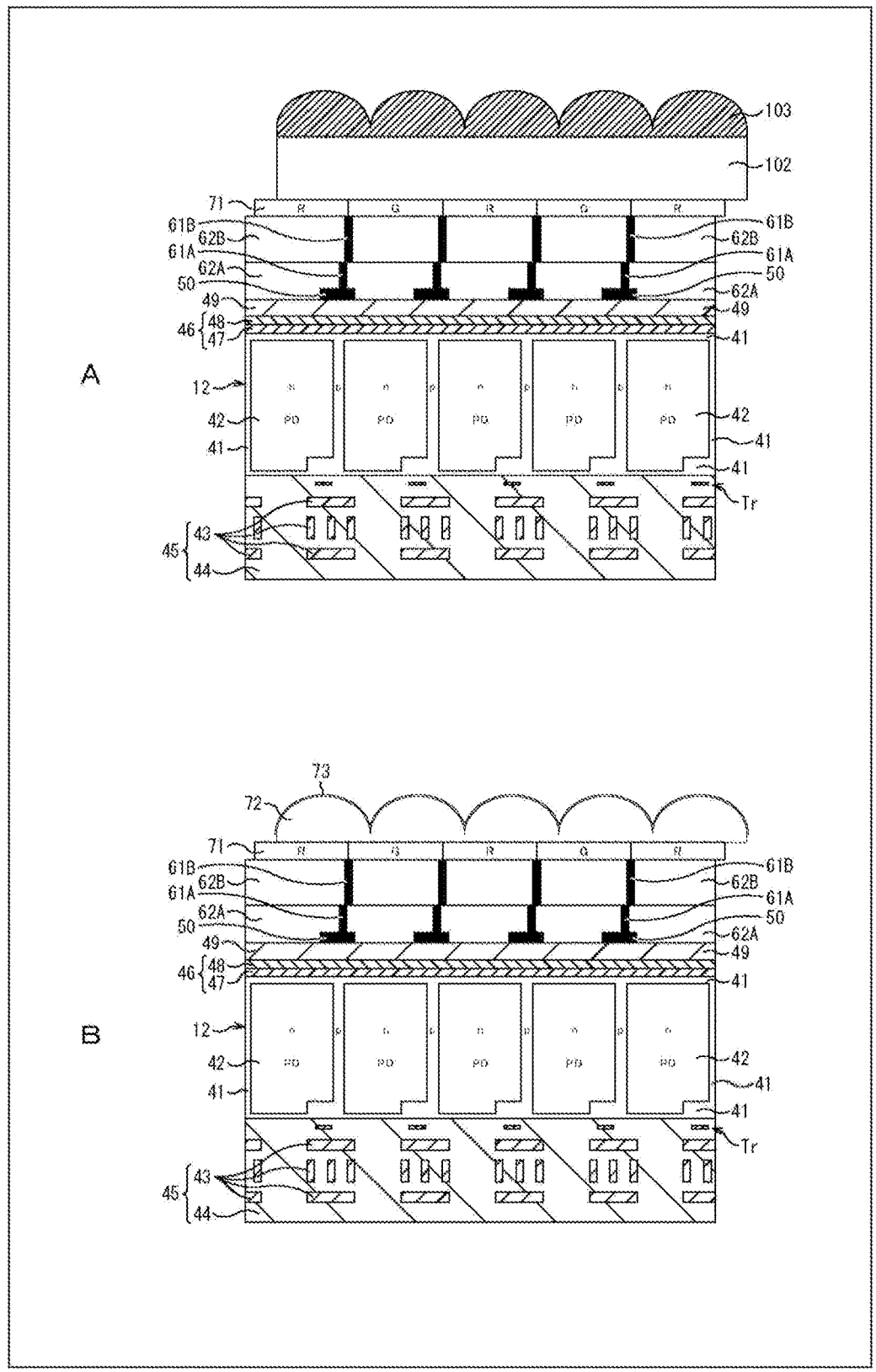
FIG. 6 is an explanatory diagram for the manufacturing method of the pixel according to the first embodiment.

As illustrated in A of FIG. 6, the photoresist 103 is formed in a lens-like shape by applying heat processing to the photoresist 103 at a temperature higher than a thermosoftening point. Then, by using the lens-like shaped photoresist 103 as a mask, a pattern transfer of the lens-like shape to the underlying on-chip lens material 102 is performed by using a dry etching method, thereby forming the on-chip lens 72 as illustrated in B of FIG. 6.

Note that a forming method of the on-chip lens 72 is not limited to the above-described method. For example, it may be possible to adopt a method in which heat processing is applied at the temperature higher than or equal to the thermosoftening point of the photosensitive resin after sequentially performing processes including film forming of a lens material formed of a photosensitive resin, pre-bake, exposure, development, and bleaching exposure processing.

As described above, the pixel 2 having the cross-sectional structure illustrated in FIG. 2 can be manufactured.

<Comparison with Single-Stage Light Shielding Wall>

Figure 7:
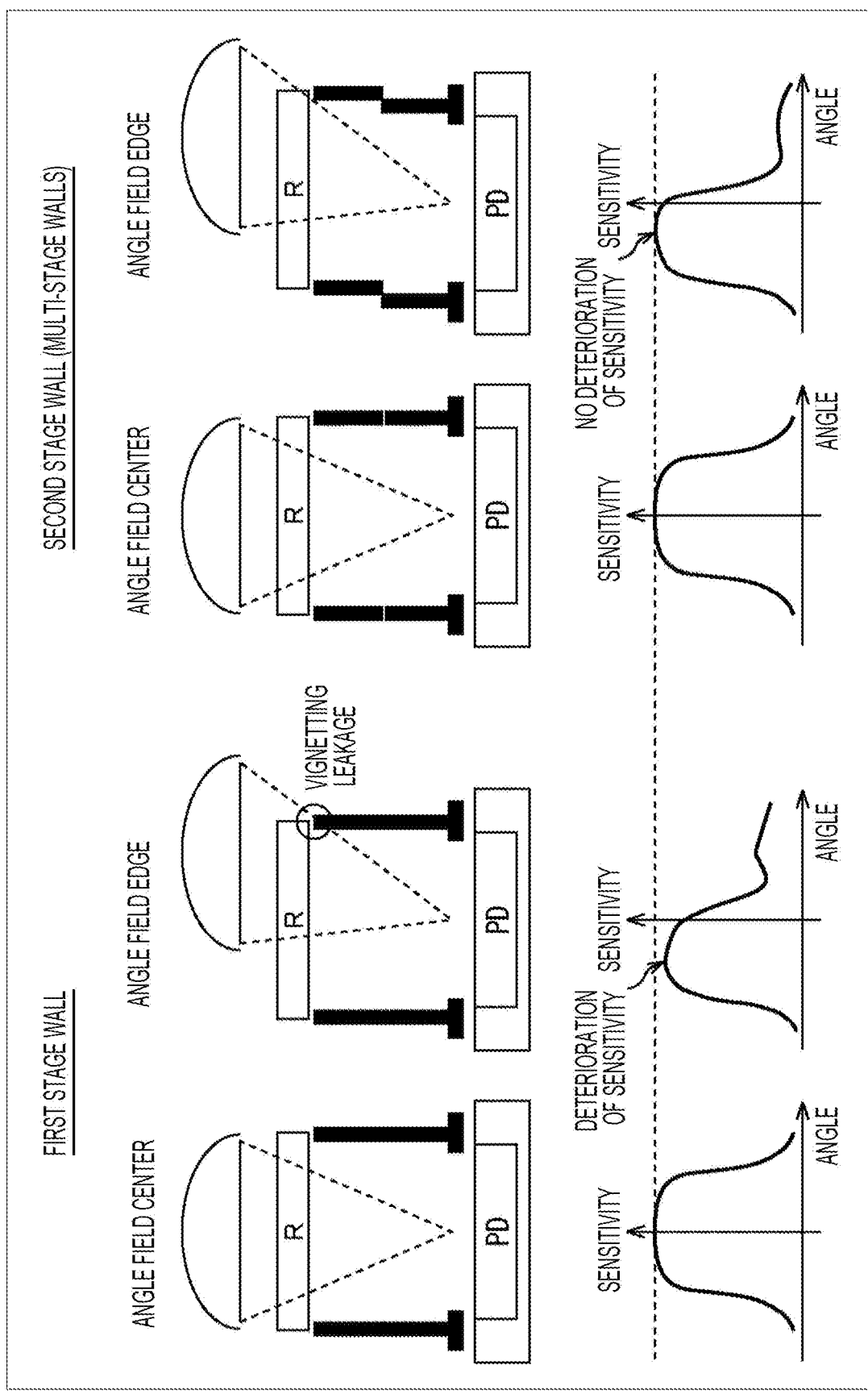
FIG. 7 is an explanatory diagram for light receiving characteristics in the case of forming a single-stage light shielding wall and in the case of forming multi-stage light shielding walls.

FIG. 7 illustrates distribution of light receiving characteristics between a case of forming a single-stage light shielding wall 61 and the case of forming the multi-stage (two-stage) light shielding walls 61 like the pixel structure in the present disclosure.

The pixel structure in the present disclosure includes multi-stage light shielding walls 61, and different pupil correction is set for each of the light shielding walls 61. More specifically, the multi-stage light shielding walls 61 have a stacking structure near the center (angle field center) of the pixel array unit 3, and the closer to the outer periphery (angle field edge) of the pixel array unit 3 a position approaches, the more the light shielding wall 61 of an upper stage is deviated to the center side of the pixel array unit 3 than the light shielding wall 61 of a lower stage. The higher the stage is, the larger a pupil correction amount is, and the pupil correction amount of the topmost stage is equal to or less than a pupil correction amount of the color filter.

As illustrated in FIG. 7, in the case of forming the single-stage light shielding wall 61, vignetting and leakage of incident light may occur at an angle field edge, and sensitivity is degraded as illustrated in the distribution of the light receiving characteristics, and shading may occur at the angle field edge.

In contrast, in the case of forming the multi-stage (at least two-stage) light shielding walls 61 like the pixel structure in the present disclosure, the pupil correction amount of the light shielding wall 61 of each stage can be changed. Therefore, since the light can be made to enter the photodiode PD without leakage, sensitivity is prevented from being degraded even at the angle field edge.

Therefore, according to the pixel structure of the pixel 2 of the first embodiment illustrated in FIG. 2, color mixture to an adjacent pixel can be resolved and shading at the angle field edge can be suppressed.

Furthermore, since the pupil correction amount can be changed in the light shielding wall 61 of each stage, freedom of light condensing design can be improved.

Moreover, since the multi-stage light shielding walls 61 are formed, an aspect ratio of each of the light shielding walls 61 (ratio between a width and a depth in the plane direction) can be reduced, and a embedding property of a metallic material and a process margin can be secured at the time of forming the light shielding wall 61. Consequently, the process margin can be enlarged and process construction can be facilitated.

4. Second Embodiment of Pixel

Figure 8:
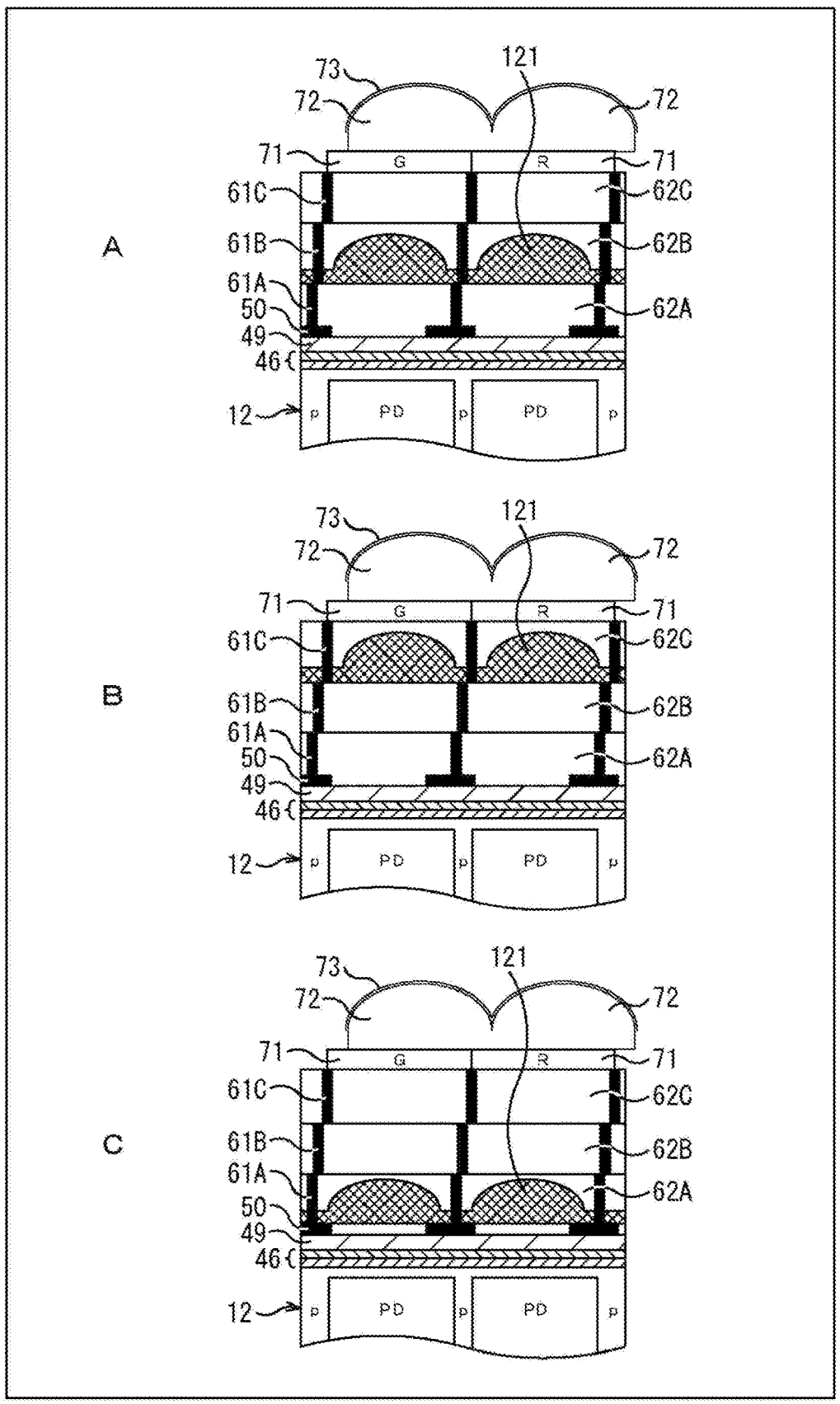
FIG. 8 is a cross-sectional view illustrating a structure of a pixel according to a second embodiment.

FIG. 8 is a cross-sectional view illustrating a structure of a pixel 2 according to a second embodiment.

A pixel 2 according to the second embodiment is formed of light shielding walls 61 in which the number of the stages is three, and an inner lens 121 is formed on one of these stages.

More specifically, a second light shielding wall 61B and a second flattened film 62B as a second light shielding wall layer are formed on a first light shielding wall 61A and a first flattened film 62A as a first light shielding wall layer, and a third light shielding wall 61C and a third flattened film 62C as a third light shielding wall layer are formed on the second light shielding wall 61B and the second flattened film 62B.

Furthermore, in a pixel structure in A of FIG. 8, the inner lens 121 is formed in a middle layer (second light shielding wall layer) out of the three-stage light shielding wall layers.

In contrast, in a pixel structure in B of FIG. 8, the inner lens 121 is formed in a topmost layer (third light shielding wall layer) out of the three-stage light shielding wall layers.

Furthermore, in a pixel structure in C of FIG. 8, the inner lens 121 is formed in a lowermost layer (first light shielding wall layer) out of the three-stage light shielding wall layers.

Meanwhile, in the examples in A of FIG. 8 to C of FIG. 8, each pixel 2 includes the inner lens 121 in one of the three-stage light shielding wall layers, but there also may be a pixel 2 not including the inner lens 121.

5. Third Embodiment of Pixel

Figure 9:
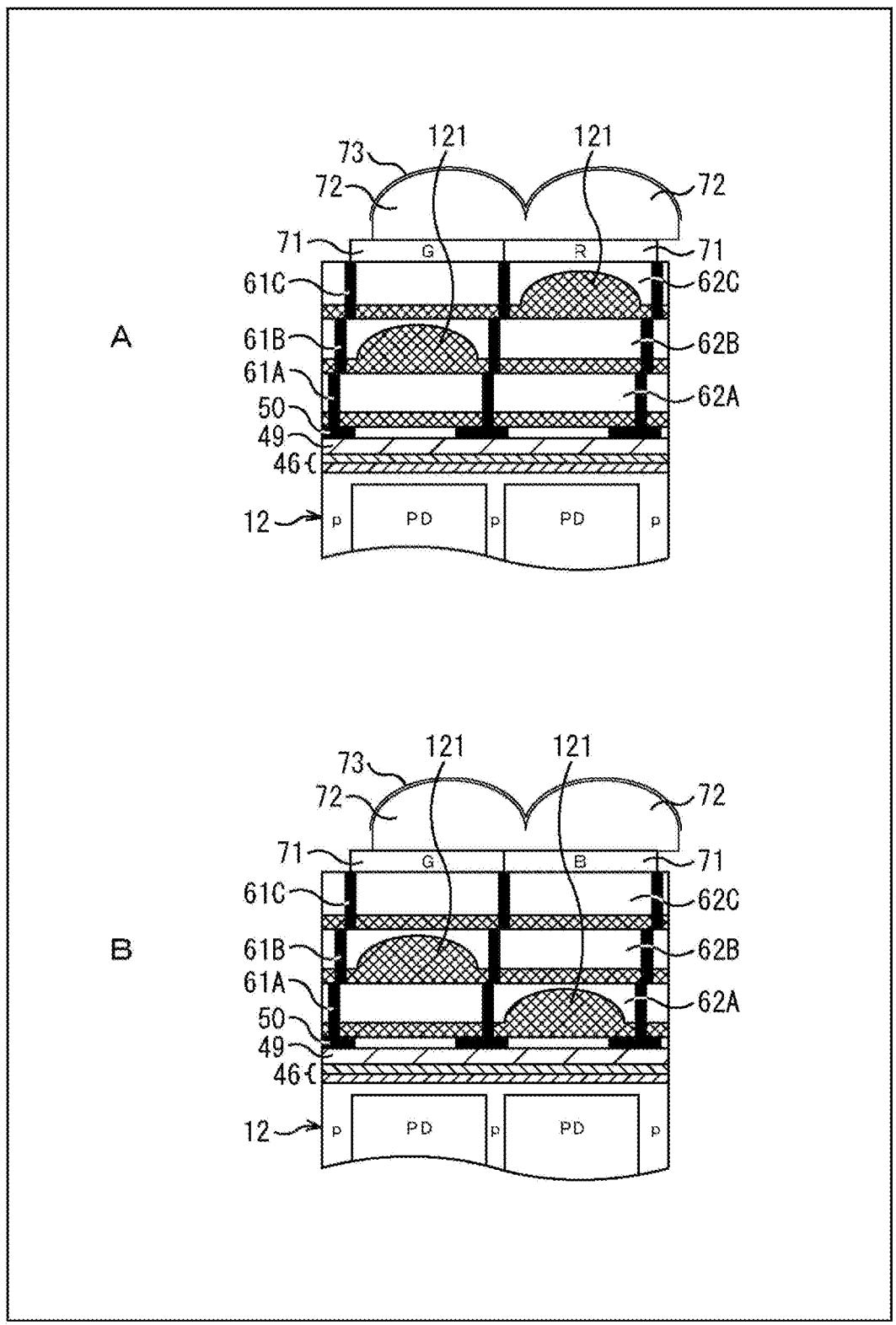
FIG. 9 is a cross-sectional view illustrating structures of a pixel according to a third embodiment.

FIG. 9 is a cross-sectional view illustrating structures of a pixel 2 according to a third embodiment.

A pixel structure of the third embodiment has the same structure as a second embodiment illustrated in FIG. 8 in which the light shielding walls 61 are formed in three stages.

However, the pixel structure of the third embodiment differs from the second embodiment in that a light shielding wall layer to be formed with an inner lens 121 out of the three-stage light shielding wall layers is varied by a color of color filter 71.

A of FIG. 9 is a cross-sectional view illustrating a structure of a 2 pixel in a pixel row where color filters 71 of G and R are alternately arranged, and B of FIG. 9 is a cross-sectional view illustrating a structure of a 2 pixel in a pixel row where color filters 71 of G and B are alternately arranged.

As illustrated in A of FIG. 9 and B of FIG. 9, the inner lens 121 is formed on a topmost layer (third light shielding wall layer) out of the three-stage light shielding wall layers in the pixel 2 formed with the R color filter 71, and the inner lens 121 is formed on a middle layer (second light shielding wall layer) in the pixel 2 formed with the G color filter 71. Additionally, the inner lens 121 is formed on a lowermost layer (first light shielding wall layer) in the pixel 2 formed with the B color filter 71.

Therefore, the inner lens 121 in FIG. 9 is arranged in a manner that the longer a wavelength is, the higher layer side the inner lens 121 is located in. The higher light shielding wall layer the inner lens 121 is located in, the more an effect of bending light is provided. Therefore, the longer the wavelength the light has, the more chromatic aberration can be reduced by condensing the light early (more on the higher layer side) with the inner lens 121.

6. Fourth Embodiment of Pixel

Figure 10:
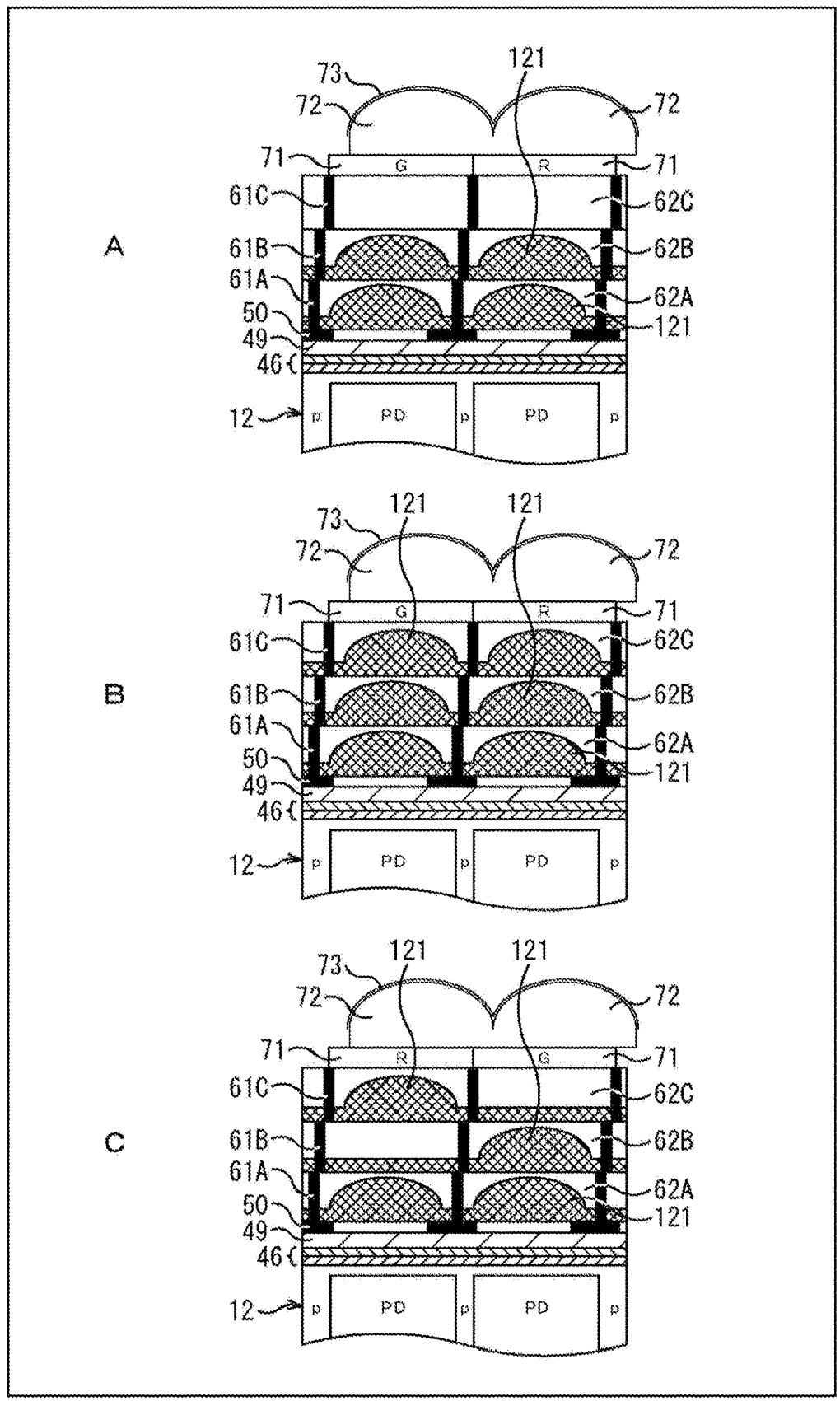
FIG. 10 is a cross-sectional view illustrating structures of a pixel according to a fourth embodiment.

FIG. 10 is a cross-sectional view illustrating structures of a pixel 2 according to a fourth embodiment.

A pixel structure of the fourth embodiment has the same structure as a second embodiment illustrated in FIG. 8 in which number of the stages of the light shielding walls 61 is three.

The pixel structure of the fourth embodiment differs from the second embodiment in that inner lenses 121 are formed on multiple light shielding wall layers of the three-stage light shielding wall layers.

In a pixel structure in A of FIG. 10, the inner lenses 121 are formed in a middle layer (second light shielding wall layer) and a lowermost layer (first light shielding wall layer) out of the three-stage light shielding wall layers.

In a pixel structure in B of FIG. 10, the inner lenses 121 are formed in all of the layers (first to third light shielding wall layers) out of the three-stage light shielding wall layers.

In a pixel structure in C of FIG. 10, a light shielding wall layer to be formed with the inner lens 121 out of the three-stage light shielding wall layers is varied by a color of a color filter 71. More specifically, the inner lenses 121 are formed on the lowermost layer (first light shielding wall layer) and the topmost layer (third light shielding wall layer) in the pixel 2 formed with the R color filter 71, and the inner lenses 121 are formed on a middle layer (second light shielding wall layer) and the lowermost layer (first light shielding wall layer) in the pixel 2 formed with the G color filter 71.

Note that the number of stages of the light shielding wall layers and the light shielding wall layers to be formed with the inner lens 121 can be suitably selected and determined, not limited to the examples illustrated in FIGS. 8 to 10.

7. Pixel Structure of Phase Difference Pixel

A pixel structure of a phase difference pixel 2P will be described with reference to FIG. 11.

Figure 11:
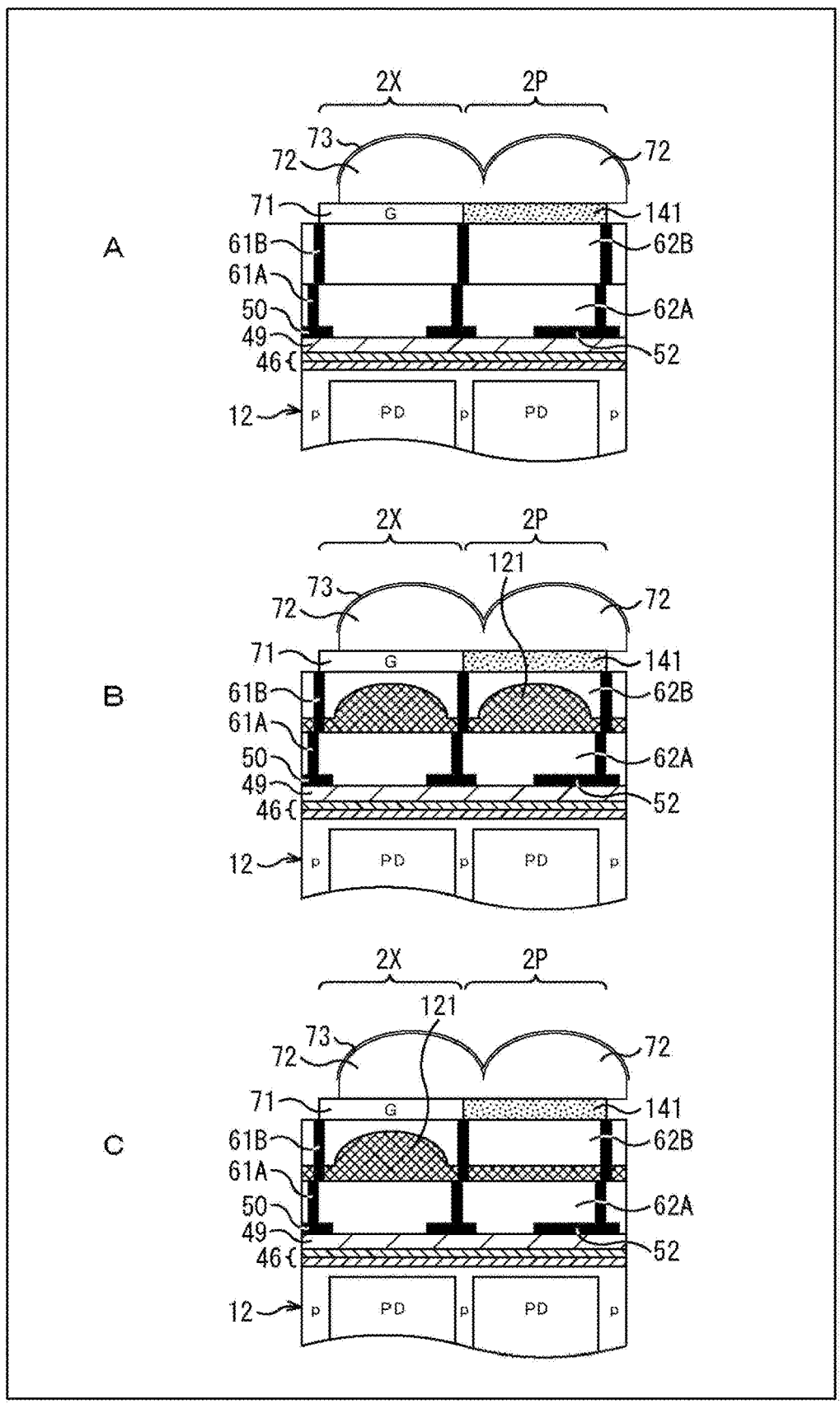
FIG. 11 is an explanatory diagram for pixel structures of a phase difference pixel.

In FIG. 11, a normal pixel 2X that outputs a pixel signal for image forming and the phase difference pixel 2P that outputs a phase difference signal are illustrated in parallel for comparison.

A in FIG. 11 illustrates a pixel structure of the phase difference pixel 2P in the case of not including an inner lens 121 like a first embodiment illustrated in FIG. 2.

B in FIG. 11 illustrates a pixel structure of the phase difference pixel 2P including an inner lens 121 like the second embodiment. B in FIG. 11 is an example in which a light shielding wall layer including the inner lens 121 is the same in both the normal pixel 2X and the phase difference pixel 2P, but the light shielding wall layer including the inner lens 121 may be different between the normal pixel 2X and the phase difference pixel 2P.

C in FIG. 11 illustrates a pixel structure in which the inner lens 121 is provided in the normal pixel 2X and the inner lens 121 is not provided in the phase difference pixel 2P. In C of FIG. 11, a material of the inner lens 121 is formed flat and left as it is in the phase difference pixel 2P, but the material of the inner lens 121 may also be eliminated.

In the phase difference pixel 2P, a pupil division light shielding film 52 is formed on the same plane as an inter-pixel light shielding film 50 as described with reference to FIG. 3. In the examples of FIG. 11, the pupil division light shielding film 52 shields light on a right half of a photodiode PD.

Furthermore, in the phase difference pixel 2P, a different material 141 is embedded in a color filter 71 portion of the normal pixel 2X. The material 141 at the color filter 71 portion of the phase difference pixel 2P can be, for example, a color filter material of a cyan color in order to improve sensitivity and improve low-luminance performance in the phase difference pixel 2P. Alternatively, the same material as an on-chip lens 72 on an upper layer may also be embedded as the material 141 of the color filter 71 portion of the phase difference pixel 2P.

Since the pupil division light shielding film 52 is additionally provided, the phase difference pixel 2P receives influence of light shield and reflection by the pupil division light shielding film 52 compared to the normal pixel 2X, and there may be a problem of outputting an image in which a peripheral portion of the phase difference pixel 2P looks uplifted.

However, by providing the multi-stage light shielding walls 61 like the present disclosure, the normal pixel 2X can prevent color mixture caused by the light from the phase difference pixel 2P. Additionally, by providing the multi-stage light shielding walls 61, a focus point can be optionally set without considering influence to the periphery. Therefore, separation characteristics can be optimized because the focus point can be adjusted to the pupil division light shielding film 52.

In the normal pixel 2X, the pupil correction amount can be changed in each of the multi-stage light shielding walls 61. Therefore, freedom of light condensing design can be improved and color mixture and shading are prevented from being deteriorated. Therefore, both oblique light characteristics and sensitivity can be improved, and both of normal pixel characteristics and phase difference pixel characteristics can be achieved.

Furthermore, in the case of providing the inner lens 121 in the normal pixel 2X like B in FIG. 11 and C in FIG. 11, oblique light characteristics of the normal pixel 2X can be improved while keeping or controlling the separation characteristics of the phase difference pixel 2P.

8. Forming Method of Inner Lens

A forming method of an inner lens 121 in the case of providing the inner lens 121 in a light shielding wall layer will be described with reference to FIG. 12.

Figure 12:
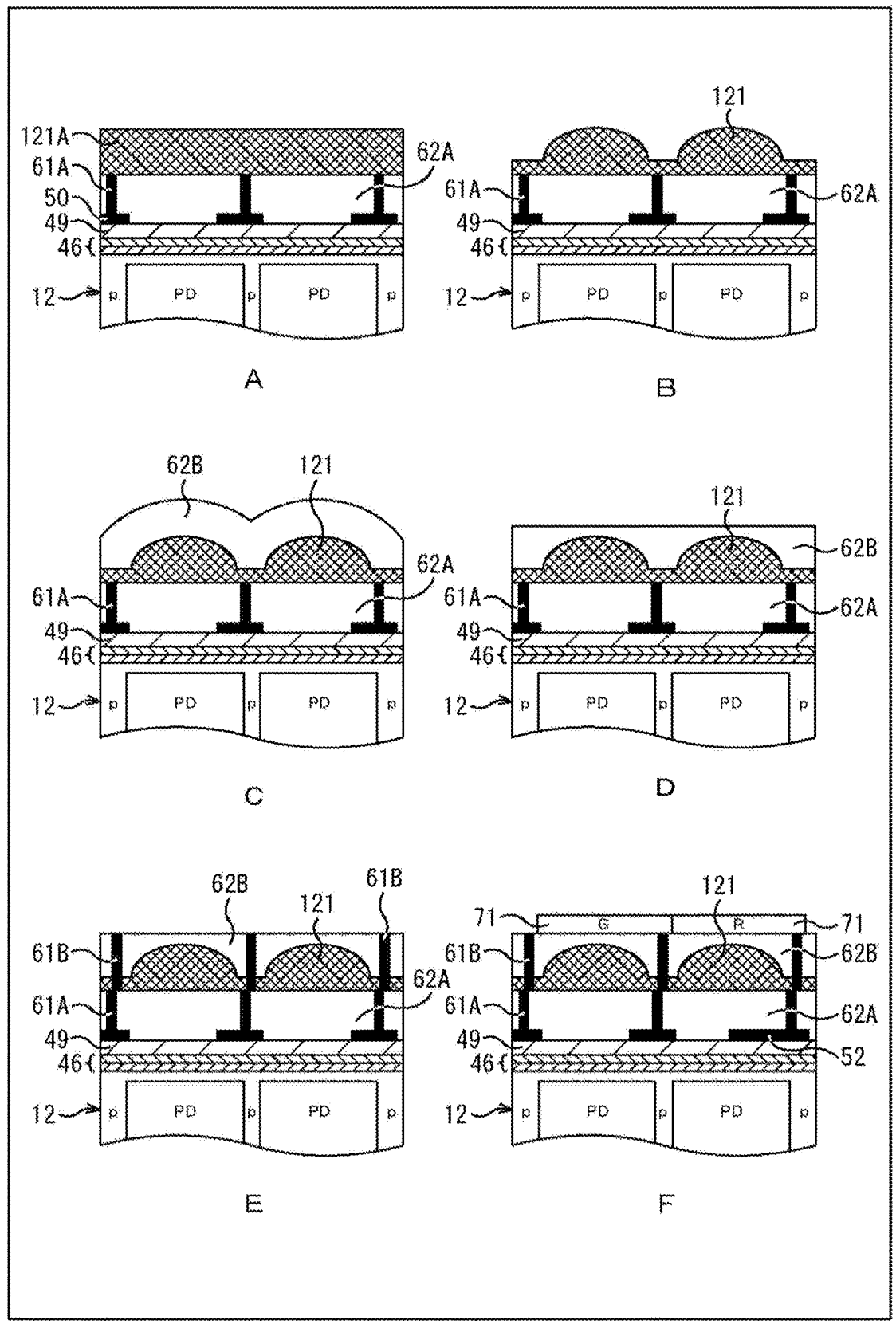
FIG. 12 is an explanatory diagram for a forming method of an inner lens.

FIG. 12 illustrates the forming method in the case of providing the inner lens 121 in the light shielding wall layer of the second stage out of two-stage light shielding wall layers.

First, as illustrated in A of FIG. 12, manufacture is performed up to a state in which a light shielding wall layer of a first stage (first light shielding wall 61A and first flattened film 62A) is formed (state same as D of FIG. 4), and then a film of an inner lens material 121A is formed on the formed light shielding wall layer of the first stage. As the inner lens material 121A, inorganic materials such as SiN and SiON may be applied.

Then, same as the forming method of the on-chip lens 72 described with reference to A of FIG. 6 and B of FIG. 6, a pattern of a lens shape of a photoresist (not illustrated) is transferred, thereby forming the inner lens 121 as illustrated in B of FIG. 12.

A pupil correction amount of the inner lens 121 is, preferably, the same as a pupil correction amount of the light shielding wall 61 of the light shielding wall layer where the inner lens 121 exits in order to prevent the light shielding wall 61 from being formed on the inner lens 121 even in the case where there are process variations in the respective light shielding wall layers. In the case where process variations are not so significant, there is no problem in applying, as the pupil correction amount of the inner lens 121, a pupil correction amount that differs from that of the light shielding wall 61 of the light shielding wall layer where the inner lens 121 exists.

Next, as illustrated in C of FIG. 12, a film of a second flattened film 62B is formed on the formed on the formed inner lens 121, and the formed second flattened film 62 is flattened by the CMP or the like as illustrated in D of FIG. 12.

After that, as illustrated in E of FIG. 12, a second light shielding wall 61B is formed in the same manner described with reference to C of FIG. 4 and D of FIG. 4.

After that, a color filter 71 and an on-chip lens (not illustrated) are sequentially formed in the same manufacturing method of the pixel 2 according to the above-described first embodiment.

FIG. 12 is the forming method in the case of forming the light shielding wall 61 on the light shielding wall layer of the second stage, but not limited to the second stage, the light shielding wall can be formed on any light shielding wall layer in the same forming method.

9. Shape of On-chip Lens

A shape of an on-chip lens 72 will be described with reference to FIG. 13.

Any shape can be selected for the shape of the on-chip lens 72, but typical shapes may be: a round shape in which the on-chip lens 72 has the same curvature in a horizontal cross-section and an oblique cross-section; and a square shape in which the curvature of the on-chip lens 72 in the horizontal cross-section differs from the curvature in the oblique cross-section.

Figure 13:
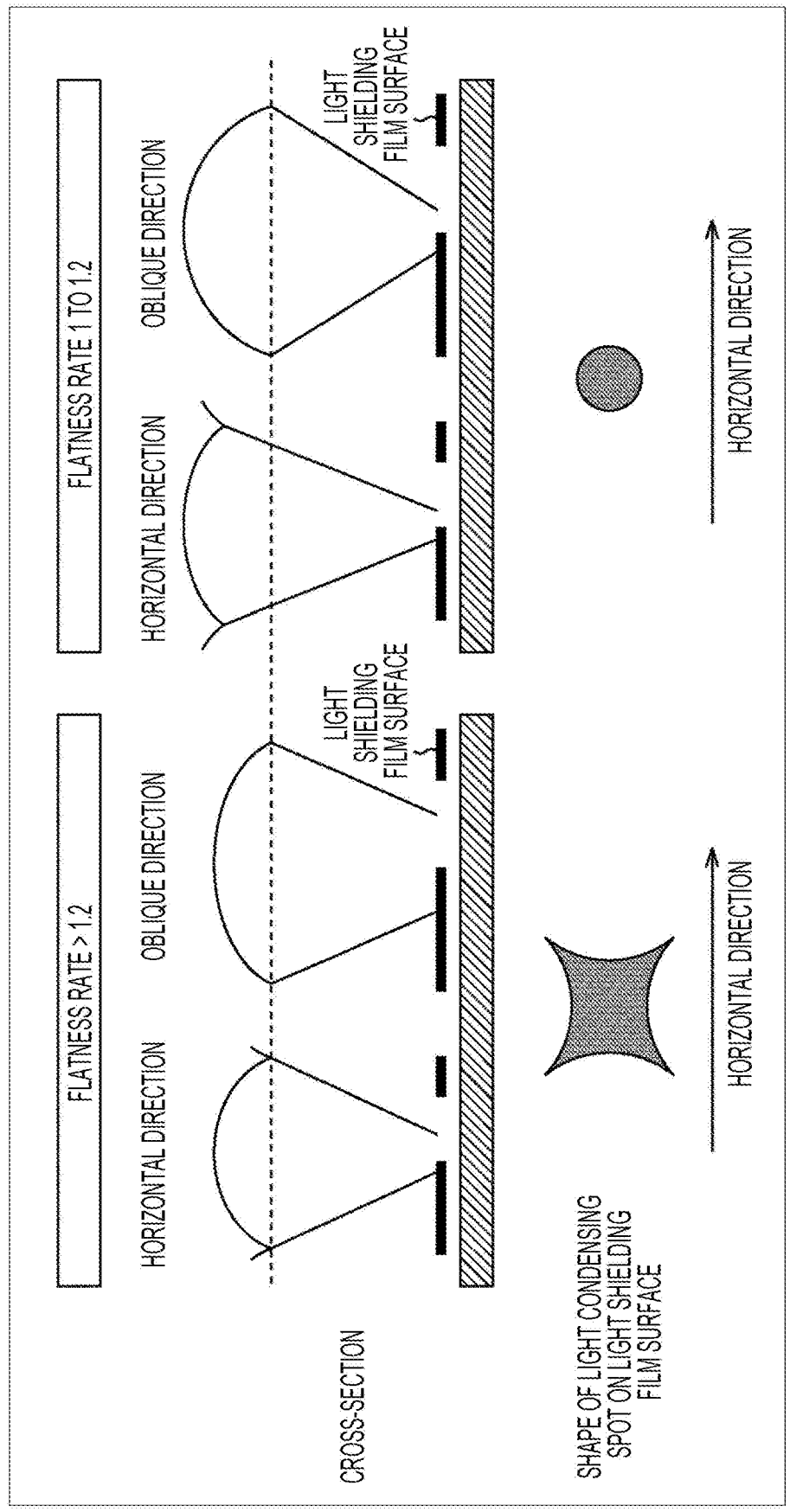
FIG. 13 is an explanatory diagram for a shape of an on-chip lens.

FIG. 13 illustrates: the horizontal cross-sections and the oblique cross-sections of the on-chip lens 72 in the respective cases of the round shape and the square shape; and shapes of light condensing spots on a light shielding film surface same as the inter-pixel light shielding film 50 and the pupil division light shielding film 52.

In the case where the shape of the on-chip lens 72 is the square shape, the shapes having the different curvatures are formed on the horizontal cross-section and the oblique cross-section. Therefore, a refractive angle of incident light is varied and the light condensing spot is broadened. However, according to the pixel structure in the present disclosure, multi-stage light shielding walls 61 are formed and optimal pupil correction is applied for each of the light shielding walls 61. Therefore, sensitive loss can be more reduced compared to a single-stage light shielding wall 61.

In the case of arranging a phase difference pixel 2P inside a pixel array unit 3, preferably, the shape of the on-chip lens 72 is formed in the round shape because the light condensing spot is desired to be converged small in order to obtain phase difference characteristics.

Figure 14:
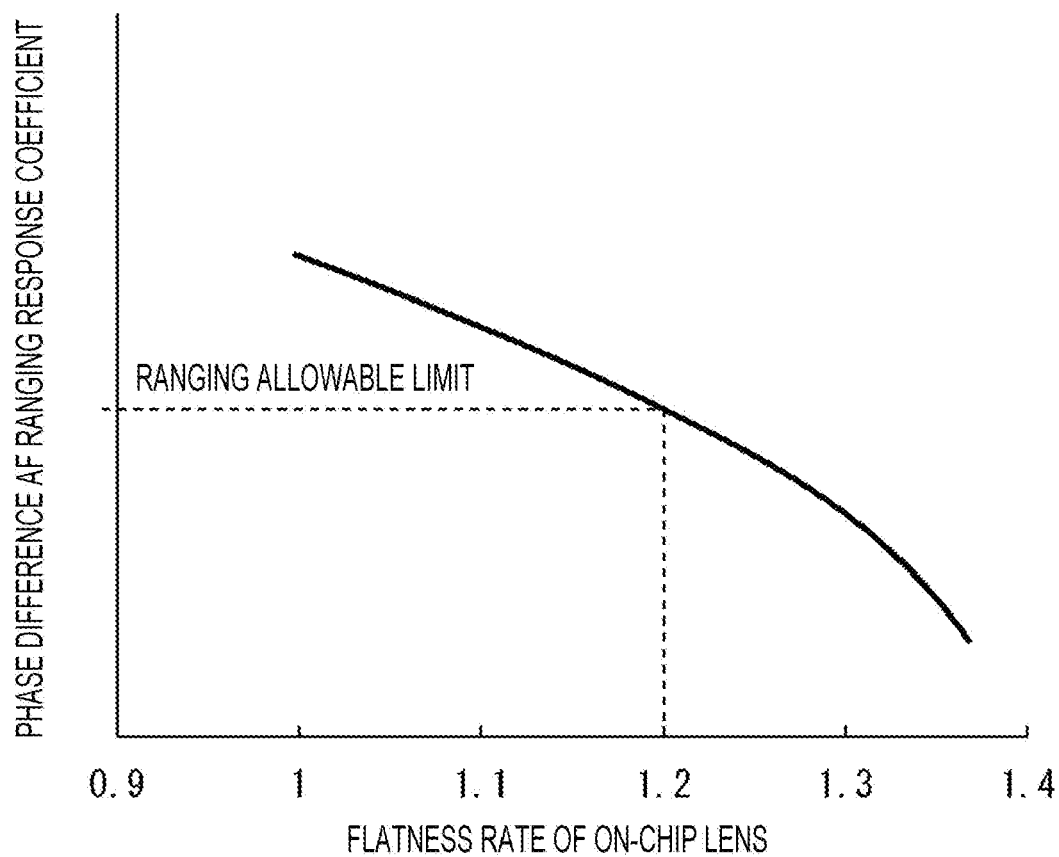
FIG. 14 is a diagram illustrating a relation between a ranging allowable limit and a flatness rate in phase difference auto-focus.

Provided that a ratio of a radius of curvature between the oblique direction and the horizontal direction of the on-chip lens 72 (=radius of curvature in oblique direction/radius of curvature in horizontal direction) is referred to as a flatness rate, the flatness rate is preferably within a range from 1 to 1.2 in order to keep a level in which a ranging allowable limit by phase difference auto-focus is prevented from being decreased as illustrated in FIG. 14. In a solid-state imaging device 1 having a pixel size of 3 um or more, the curvatures of the on-chip lens 72 between the horizontal direction and the oblique direction can be hardly become the same in most cases. In such a case, preferably, the flatness rate is set in the range from 1 to 1.2 in order to keep the phase difference characteristics.

10. Light Shielding Structure in OPB Area

Next, a light shielding structure in an OPB area outside a pixel effective area will be described.

Figure 15:
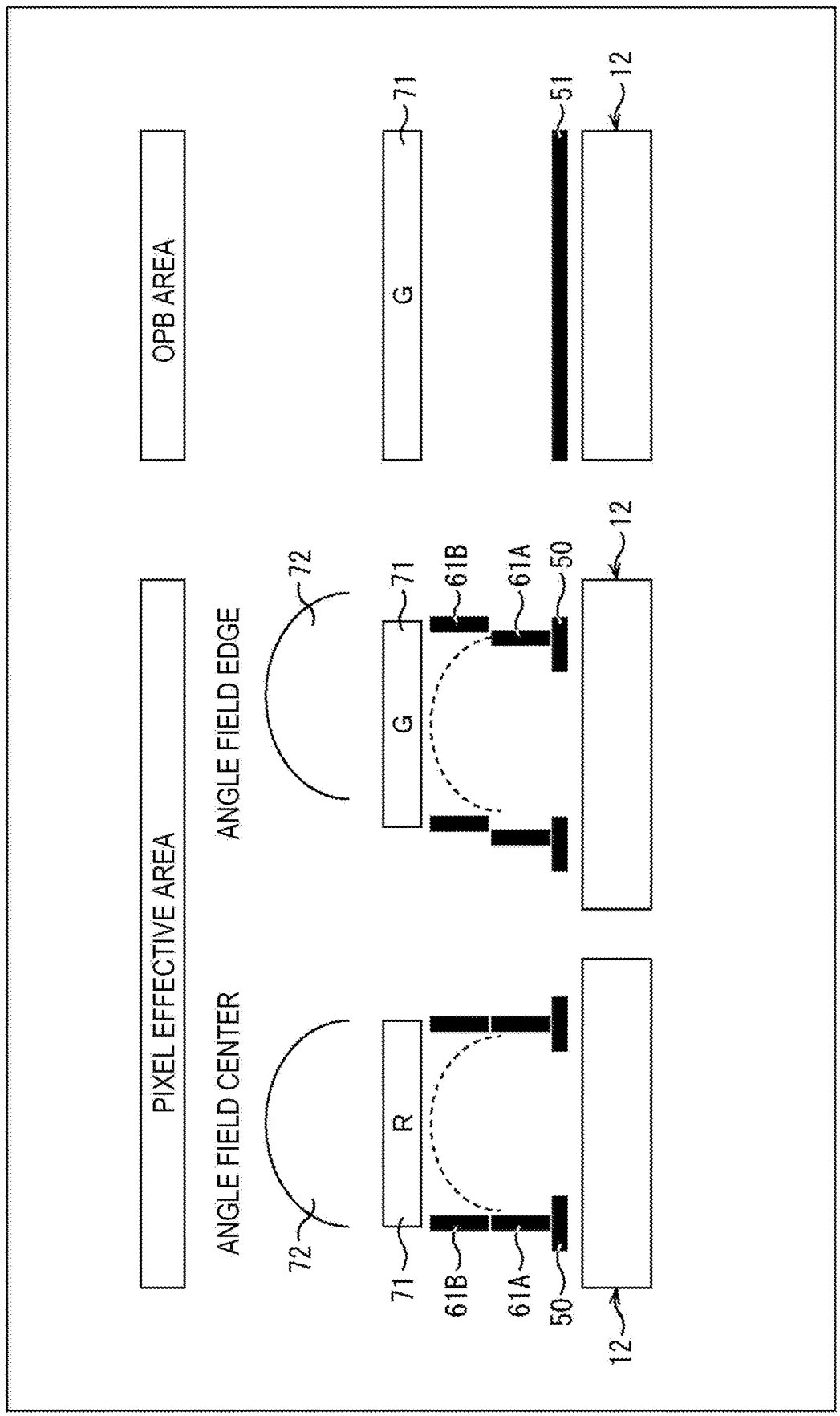
FIG. 15 is a diagram to describe a first exemplary configuration of a light shielding structure in an OPB area.

FIG. 15 is a diagram to describe a first exemplary configuration of a light shielding structure in an OPB area outside the pixel effective area.

In the pixel effective area, the two-stage light shielding walls 61 of the first light shielding wall 61A and the second light shielding wall 61B are formed as described, and the light shielding walls are formed such that the closer to the peripheral portion (angle field edge) a position approaches from the center portion (angle field center) of the pixel array unit 3, the larger the pupil correction amount becomes.

In contrast, in the OPB area outside the pixel effective area, it is possible to have a light shielding structure in which only the OPB forming film 51 illustrated in FIG. 3 is formed as illustrated in FIG. 15. Meanwhile, in the example of FIG. 15, a G color filter 71 is formed in the OPB area, but since the OPB area is an area that does not receive light, presence and a color of the color filter 71 are not limited.

Figure 16:
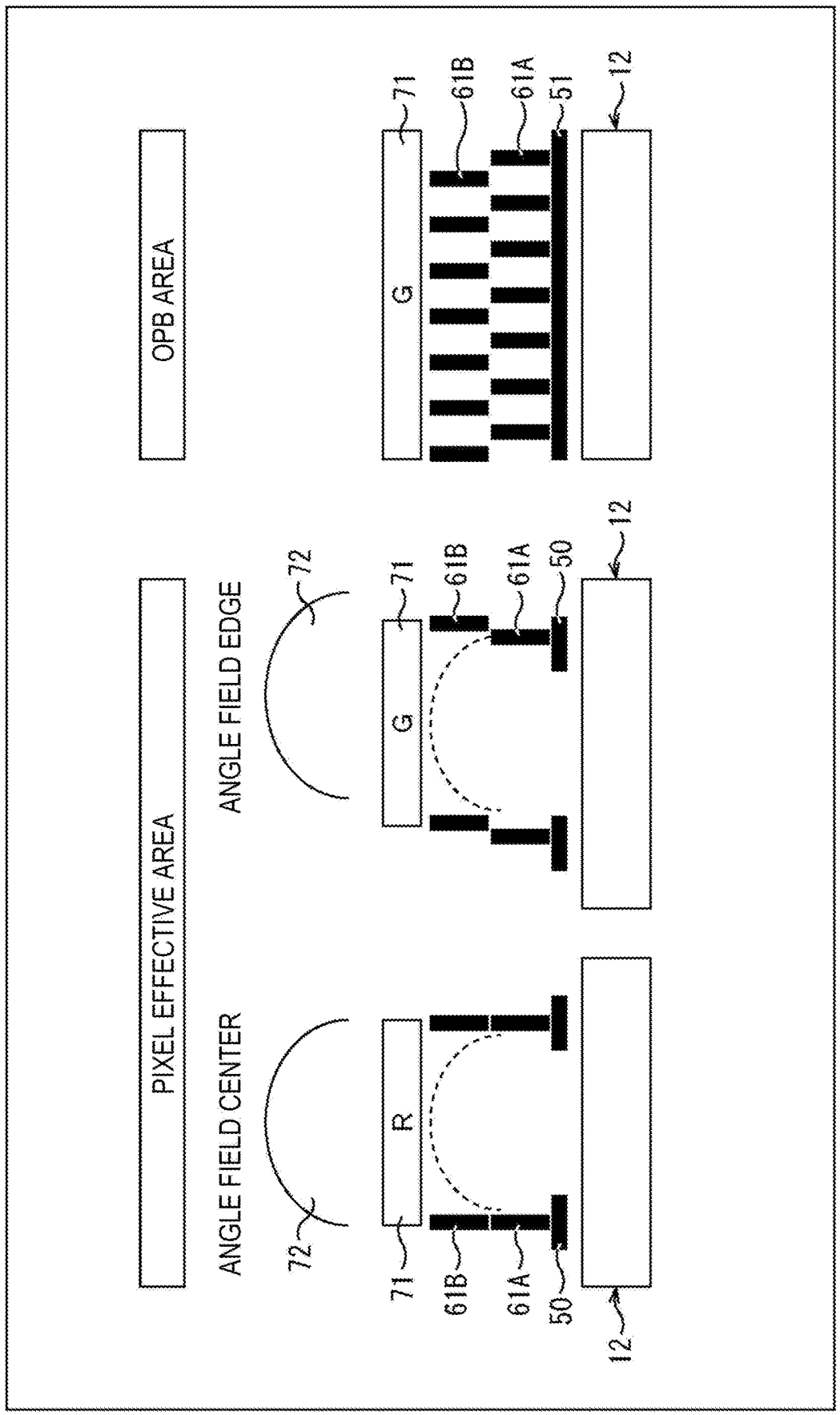
FIG. 16 is a diagram to describe a second exemplary configuration of the light shielding structure in the OPB area.

FIG. 16 is a diagram to describe a second exemplary configuration of the light shielding structure in the OPB area outside the pixel effective area.

In the OPB area outside the pixel effective area, it is possible to apply not only the light shielding structure formed with only the OPB forming film 51 as illustrated in FIG. 15 but also a light shielding structure in which, for example, the two-stage light shielding walls 61 of the first light shielding wall 61A and the second light shielding wall 61B are formed on the OPB forming film 51 same as the pixel effective area as illustrated in FIG. 16. With this structure, a light shielding property can be improved compared to the case where only the OPB forming film 51 is formed as illustrated in FIG. 15.

Since the two-stage light shielding walls 61 are formed in the OPB area such that the first light shielding wall 61A and the second light shielding wall 61B are located at different positions in the plane direction respectively as illustrated in FIG. 16, dense pattern can be formed in the plane direction, and a light shielding effect can be more improved. Furthermore, the smaller an interval (patter pitch) in the plane direction of the light shielding wall 61 is, the more the light shielding effect is improved.

A manufacturing method of the light shielding structure in the OPB area illustrated in FIG. 16 will be described with reference to FIG. 17. Note that only forming an OPB forming film 51, a first light shielding wall 61A, and a second light shielding wall 61B will be described in FIG. 17. As for other portions, the manufacturing method is the same as the method described with reference to FIGS. 4 to 6.

Figure 17:
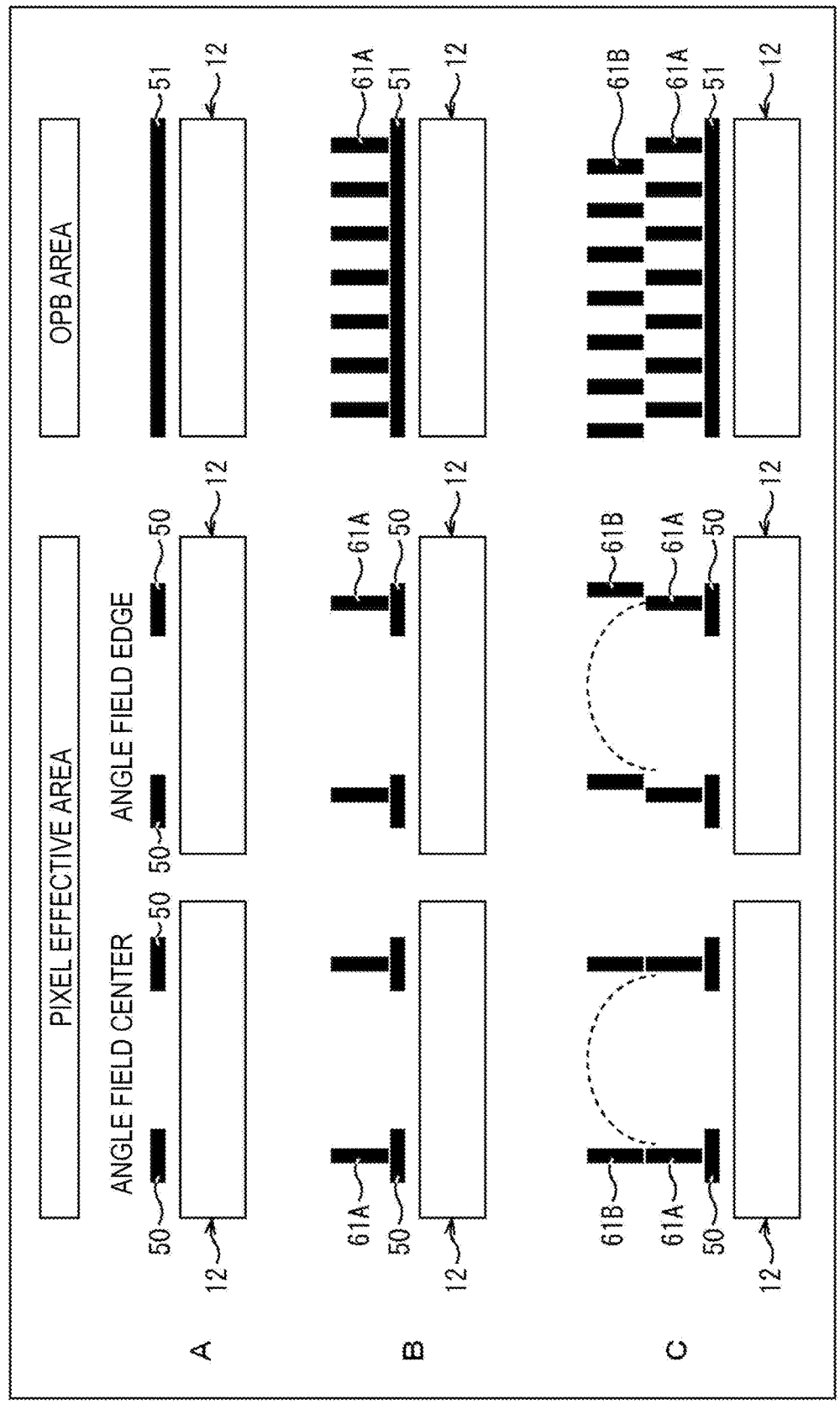
FIG. 17 is a diagram to describe a manufacturing method of the light shielding structure in the OPB area illustrated in FIG. 16.

First, as illustrated in A of FIG. 17, an inter-pixel light shielding film 50 is formed in the pixel effective area, and simultaneously the OPB forming film 51 is formed of the material same as the inter-pixel light shielding film 50 also in the OPB area.

Next, as illustrated in B of FIG. 17, the first light shielding wall 61A is formed in the pixel effective area, and simultaneously the first light shielding wall 61A is formed in the OPB area.

Then, as illustrated in C of FIG. 17, the second light shielding wall 61B is formed in the pixel effective area, and simultaneously the second light shielding wall 61B is formed also in the OPB area. Here, the first light shielding wall 61A and the second light shielding wall 61B in the pixel effective area are arranged at positions subjected to pupil correction in accordance with an image height. As for the first light shielding wall 61A and the second light shielding wall 61B in the OPB area, the position of the first light shielding wall 61A of the first stage is arranged in a manner deviated from the position of the second light shielding wall 61B of the second stage in the plane direction.

As described above, the light shielding wall 61 in the OPB area and the light shielding wall 61 in the pixel effective area can be formed at the same time by the same processes. Therefore, a light shielding property in the OPB area can be improved without increasing the number of processes. Furthermore, process uniformity is improved by forming the same pattern in the pixel effective area and the OPB area.

Meanwhile, the detailed forming method of the light shielding wall 61 in the OPB area is the same as the forming method of the light shielding wall 61 in the pixel effective area described with reference to FIG. 4. More specifically, the multi-stage light shielding walls 61 can be formed by repeating the following processes: forming a film of an inorganic material such as SiO2 to be a flattened film 62;

forming an opening portion 101 by performing etching processing to a portion to be formed with the light shielding wall 61; embedding a metallic material such as tungsten or copper in the opening portion 101; and then applying the CMP to an entire surface.

Figure 18:
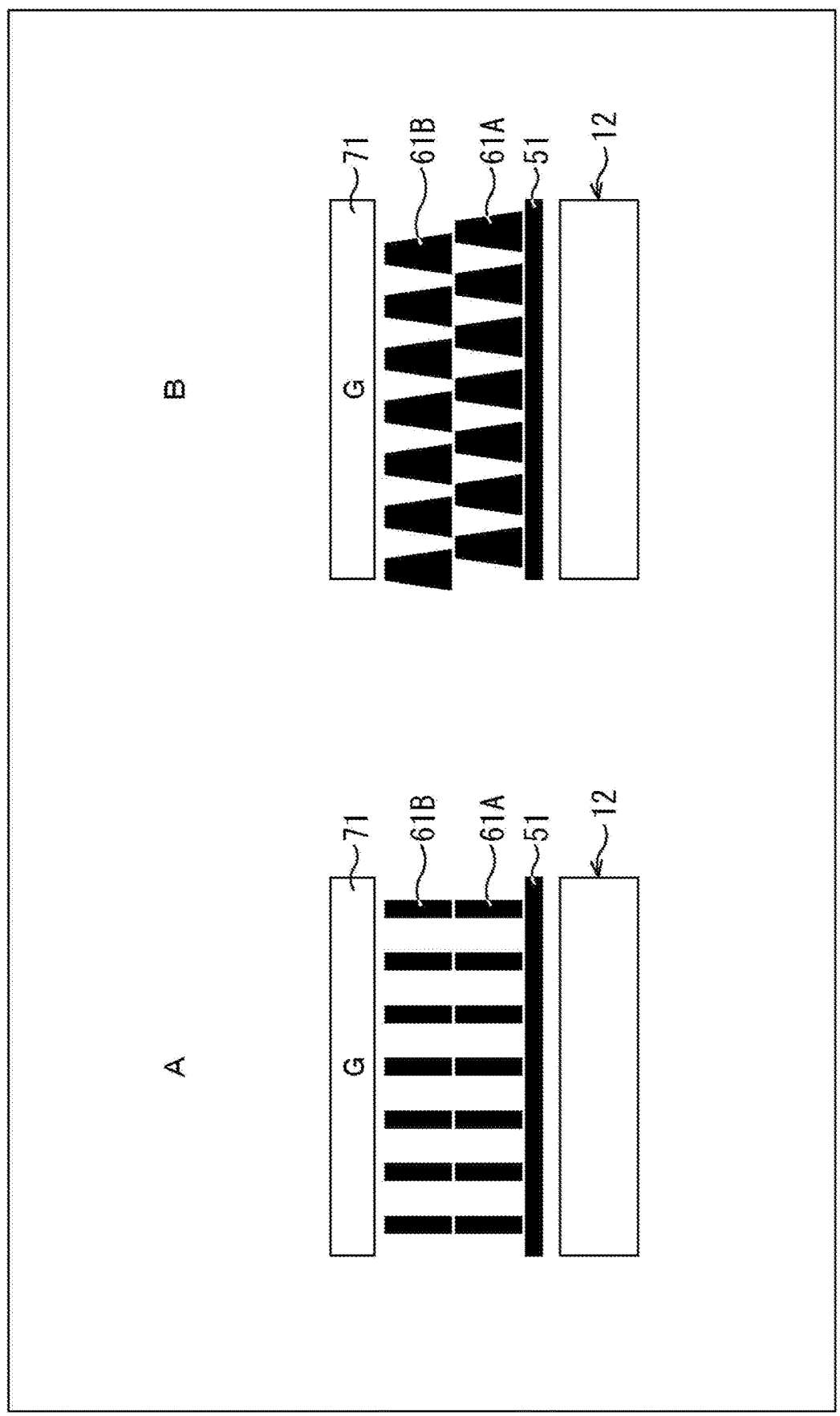
FIG. 18 is a diagram illustrating other exemplary structures of a light shielding wall in the OPB area.

FIG. 18 is a diagram illustrating other exemplary structures of the light shielding wall 61 that can be formed in the OPB area.

A of FIG. 18 illustrates an exemplary structure of the light shielding wall 61 in which a first light shielding wall 61A of a first stage and a second light shielding wall 61B of a second stage are arranged in a manner vertically superimposed.

B of FIG. 18 is an exemplary structure of the light shielding wall 61 in which a cross-sectional shape of the light shielding wall 61 in each stage is formed in a manner inclined (tapered) in a depth direction. B of FIG. 18 illustrates the exemplary structure of the light shielding wall 61 having a reverse tapered shape in which a planar area of a lower surface is larger than that of an upper surface. However, it is also possible to form the light shielding wall 61 having a forward tapered shape in which the planar area of the lower surface is smaller than that of the upper surface. By forming the cross-sectional shape of the light shielding wall 61 in an inclined (tapered) manner, the pattern can be formed more densely. Additionally, since the light shielding wall 61 is not used as wiring, there is no problem in that the upper and lower light shielding walls 61 contact each other. A thickness of the light shielding layer that cannot be formed and processed only with the OPB forming film 51 can be achieved.

Meanwhile, the examples in which the number of stages of the light shielding walls 61 formed in the OPB area is two stages have been described in FIGS. 16 to 18, but in the case where the number of stages of the light shielding walls 61 formed in the pixel effective area is three or more stages, the number of the stages of the light shielding walls 61 formed in the OPB area is also three or more stages (the same number of stages of the light shielding walls 61 in the pixel effective area). The positions in the plane direction of the light shielding walls 61 in the respective stages may be different as illustrated in FIG. 16, and may also be the same as illustrated in A of FIG. 18.

11. Exemplary Substrate Configuration of Solid-State Imaging Device

Figure 19:
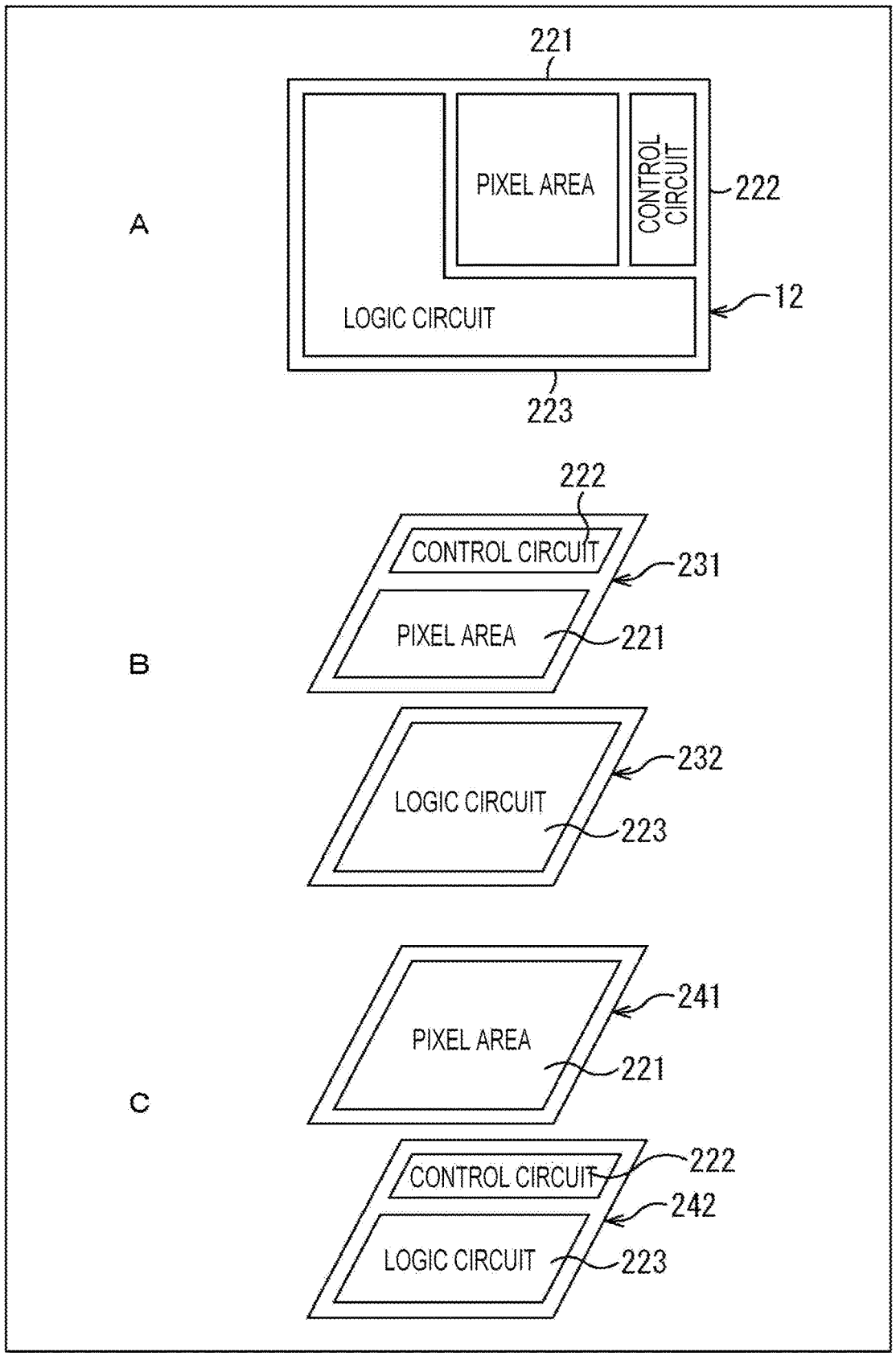
FIG. 19 is a diagram illustrating an exemplary substrate configuration of a solid-state imaging device.

As illustrated in A of FIG. 19, the solid-state imaging device 1 in FIG. 1 has a configuration in which a pixel area 221 arranged with a plurality of pixels 2, a control circuit 222 adapted to control the pixels 2, and a logic circuit 223 including a signal processing circuit for pixel signals are formed on one semiconductor substrate 12.

However, as illustrated in B of FIG. 19, the solid-state imaging device 1 may also have a configuration in which a first semiconductor substrate 231 formed with the pixel area 221 and the control circuit 222 and a second semiconductor substrate 232 formed with the logic circuit 223 are stacked. The first semiconductor substrate 231 and the second semiconductor substrate 232 are electrically connected via a through-via or by metal binding of Cu—Cu, for example.

Alternatively, as illustrated in C of FIG. 19, the solid-state imaging device 1 may also have a configuration in which a first semiconductor substrate 241 only formed with the pixel area 221, and a second semiconductor substrate 242 formed with the control circuit 222 and the logic circuit 223 are stacked. The first semiconductor substrate 241 and the second semiconductor substrate 242 are electrically connected via a through-via or by metal binding of Cu—Cu, for example.

12. Exemplary Application to Electronic Apparatus

The present disclosure is not limited to application to a solid-state imaging device. More specifically, the present disclosure can be applied to all electronic apparatuses using a solid-state imaging device in an image pick-up unit (photoelectric conversion unit), for example, an imaging apparatus such as a digital still camera or a video camera, a portable terminal device having an imaging function, and a copy machine using a solid-state imaging device in an image reading unit. The solid-state imaging device may be a configuration formed as one-chip, and also a configuration of a module form having an imaging function in which an imaging unit is packaged together with a signal processing unit or an optical system.

Figure 20:
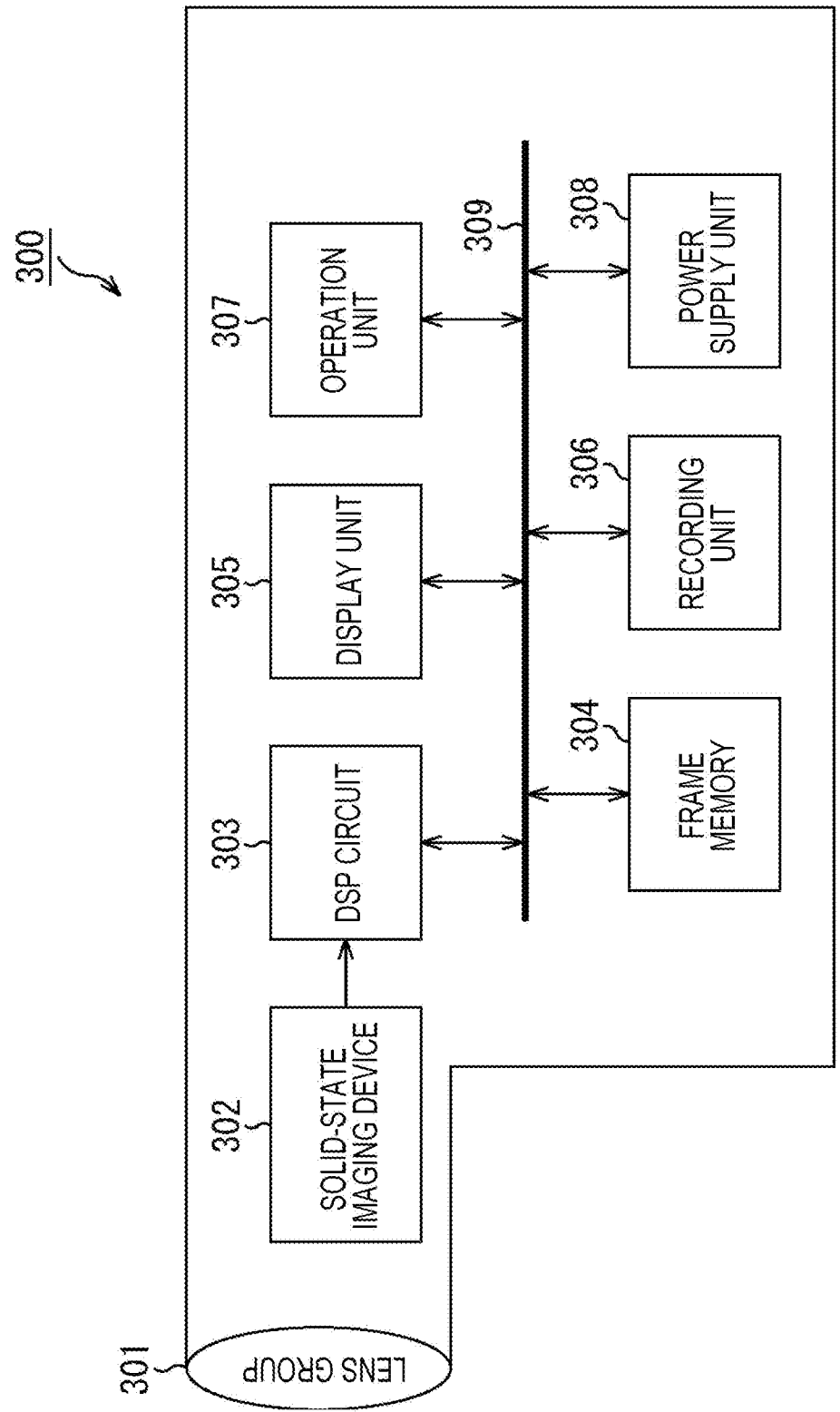
FIG. 20 is a block diagram illustrating an exemplary configuration of an imaging apparatus as an electronic apparatus according the present disclosure.

FIG. 20 is a block diagram illustrating an exemplary configuration of an imaging apparatus as an electronic apparatus according the present disclosure.

An imaging apparatus 300 in FIG. 20 includes an optical unit 301 formed of a lens group and the like, a solid-state imaging device (imaging device) 302 adopting the structure of the solid-state imaging device 1 in FIG. 1, and a digital signal processor (DSP) circuit 303 that is a camera signal processing circuit. Furthermore, the imaging apparatus 300 includes a frame memory 304, a display unit 305, a recording unit 306, an operation unit 307, and a power supply unit 308. The DSP circuit 303, frame memory 304, display unit 305, recording unit 306, operation unit 307, and power supply unit 308 are mutually connected via a bus line 309.

The optical unit 301 picks up incident light (image light) from an object and forms an image on an imaging surface of the solid-state imaging device 302. The solid-state imaging device 302 converts, to an electrical signal, a light amount of the incident light formed on the imaging surface by the optical unit 301 per pixel, and outputs the same as a pixel signal. As the solid-state imaging device 302, it is possible to use the solid-state imaging device 1 in FIG. 1, more specifically, the solid-state imaging device in which multi-stage light shielding wall layers are provided and optimal pupil correction is performed in the light shielding wall layers of the respective stages.

The display unit 305 is formed of, for example, a panel type display device such as a liquid crystal panel or an organic electro luminescence (EL) panel, and displays a moving image or a still image picked up by the solid-state imaging device 302. The recording unit 306 records the moving image or the still image picked up by the solid-state imaging device 302 in a recording medium such as a hard disk and a semiconductor memory.

The operation unit 307 provides an operational command for various kinds of functions owned by the imaging apparatus 300 under control of a user. The power supply unit 308 suitably supplies various kinds of power supply to be operation power sources of the DSP circuit 303, frame memory 304, display unit 305, recording unit 306, and operation unit 307 to these supply targets.

As described above, both the normal pixel characteristics and the phase difference pixel characteristics can be achieved and high sensitivity can be provided by using the solid-state imaging device 1 according to the above-described respective embodiments as the solid-state imaging device 302. Therefore, high image quality of a picked-up image can be achieved also in the imaging apparatus 300 such as a video camera, a digital still camera, and a camera module for a mobile apparatus like as a mobile phone.

In the above-described examples, described is the solid-state imaging device in which electrons are deemed as the signal charge by setting the first conductive type as a p-type and the second conductive type as an n-type. However, the present disclosure is also applicable to a solid-state imaging device in which a positive hole is deemed as signal charge. In other words, each of the above-described semiconductor regions can be formed of a semiconductor region having a reverse conductive type in which the first conductive type is set as the n-type and the second conductive type is set as the p-type.

Further, application of the present disclosure is not limited to application to a solid-state imaging device that detects distribution of an incident light amount of visible light and picks up the distribution as an image, and the present disclosure is applicable to a solid-state imaging device that picks up distribution of indecent light amounts of infrared, X-ray, particles, or the like as an image, and in a broad sense, applicable to all kinds of solid-state imaging devices (physical amount distribution detection devices) such as a fingerprint detection sensor that detects distribution of other physical amounts like pressure and electrostatic capacitance and picks up such distribution as an image.

The embodiments of the present disclosure are not limited to the above-described embodiments, and various kinds of modifications can be made within a range not departing from a gist of the present disclosure.

For example, an embodiment combining all or part of the above-described plurality of embodiments can be adopted.

Note that the effects recited in the present specification are merely examples and not limited thereto, and effects other than those recited in the present specification may also be provided.

Further, the present disclosure can also have the following configurations.

(1)

A solid-state imaging device including a pixel array unit in which a plurality of pixels is two-dimensionally arranged in a matrix and multi-stage light shielding walls are provided between the pixels.

(2)

The solid-state imaging device recited in above (1), wherein the solid-state imaging device is a back-illuminated type.

(3)

The solid-state imaging device recited in above (1) or (2), wherein each of the multi-stage light shielding walls is formed in a position where pupil correction is performed.

(4)

The solid-state imaging device recited in any one of above (1) to (3), wherein a pupil correction amount D of a color filter satisfies a condition of $C \leq D \leq C+X/2$ where C is a pupil correction amount and X is a width of the light shielding wall of a light shielding wall layer closest to the color filter.

(5)

The solid-state imaging device recited in above (4), wherein the pupil correction amount D of the color filter is equal to the pupil correction amount C of the light shielding wall of the light shielding wall layer closest to the color filter.

(6)

The solid-state imaging device recited in above (3), wherein a pupil correction amount of $Q^{th}$ stage (Q>2) out of the multi-stage light shielding walls is a correction amount equal to or more than a pupil correction amount of $Q-1^{th}$ stage immediately below the $Q^{th}$ stage.

(7)

The solid-state imaging device recited in any one of above (1) to (6), wherein a $Q^{th}$ stage light shielding wall (Q>2) out of the multi-stage light shielding walls is connected to the $Q-1^{th}$ stage light shielding wall immediately below at least in a part inside the pixel array unit, and the $Q^{th}$ stage light shielding wall and the $Q-1^{th}$ stage light shielding wall have electrically same potential.

(8)

The solid-state imaging device recited in any one of above (1) to (7), wherein the light shielding wall has a forward tapered shape in which an area in plane direction is increased as a position approaches to an upper side from a bottom surface.

(9)

The solid-state imaging device recited in any one of above (1) to (8), wherein a ratio of a radius of curvature between an oblique direction and a horizontal direction of an on-chip lens of the pixel is 1 to 1.2.

(10)

The solid-state imaging device recited in any one of above (1) to (9), wherein an inner lens is formed in a predetermined pixel of at least one light shielding wall layer out of multi-stage light shielding wall layers that are forming layers of the multi-stage light shielding walls.

(11)

The solid-state imaging device recited in above (10), wherein the inner lens is formed in a pixel of a color of a predetermined color filter.

(12)

The solid-state imaging device recited in above (10), wherein the light shielding wall layer formed with the inner lens is varied by a color of a color filter.

(13)

The solid-state imaging device recited in above (10), wherein presence of the inner lens is different between a normal pixel and a phase difference pixel.

(14)

The solid-state imaging device recited in above (10), wherein the light shielding wall layer formed with the inner lens is different between a normal pixel and a phase difference pixel.

(15)

The solid-state imaging device recited in any one of above (1) to (14), wherein part of the plurality of pixels is a phase difference pixel.

(16)

The solid-state imaging device recited in any one of above (1) to (15), wherein the multi-stage light shielding walls are formed in an OPB area outside a pixel effective area inside the pixel array unit.

(17)

The solid-state imaging device recited in above (16), wherein the multi-stage light shielding walls in the OPB area have a cross-sectional shape formed in a tapered shape.

(18)

The solid-state imaging device recited in above (16) or (17),
wherein positions in a plane direction of the multi-stage light shielding walls in the OPB area are different in the light shielding walls of respective stages.

(19)

A manufacturing method of a solid-state imaging device including
a step of forming multi-stage light shielding walls between pixels at the time of forming a pixel array unit in which a plurality of pixels is two-dimensionally arranged in a matrix.

(20)

An electronic apparatus provided with
a solid-state imaging device including a pixel array unit in which a plurality of pixels is two-dimensionally arranged in a matrix and multi-stage light shielding walls are provided between the pixels.

REFERENCE SIGNS LIST

1 Solid-state imaging device
2 Pixel
2P Phase difference pixel
2X Normal pixel
3 Pixel array unit
51 OPB forming film
61 (61A, 61B, 61C) Light shielding wall
71 Color filter
72 On-chip lens
231 First semiconductor substrate
232 Second semiconductor substrate
241 First semiconductor substrate
242 Second semiconductor substrate
300 Imaging apparatus
302 Solid-state imaging device

The invention claimed is:
1. A solid-state imaging device comprising:
a pixel array unit including a plurality of pixels, the plurality of pixels including a first pixel and a second pixel immediately adjacent to a first side of the first pixel;
a first multi-stage light shielding wall provided between the first pixel and the second pixel, the first multi-stage light shielding wall including:
a first light shielding wall extending through a first film; and
a second light shielding wall extending through a second film and offset from the first light shielding wall in a direction toward a periphery of the pixel array unit in a cross sectional view; a first light shielding film in contact with a first end of the second light shielding wall, wherein a width of the first light shielding film is larger than a largest width of the second light shielding wall;
a third pixel in the plurality of pixels immediately adjacent to a second side of the first pixel opposite to the first side of the first pixel so that the third pixel, the first pixel, and the second pixel are arranged in that order in a row of the pixel array unit; and
a second multi-stage light shielding wall between the first pixel and the third pixel, the second multi-stage light shielding wall including:
a third light shielding wall extending through the first film; and
a fourth light shielding wall extending through the second film and offset from the third light shielding wall in the direction toward the periphery of the pixel array unit in the cross sectional view,
wherein, in the cross sectional view, the first film includes a portion that extends uninterrupted from the first light shielding wall to the third light shielding wall, and
wherein, in the cross sectional view, the second film includes a portion that extends uninterrupted from the second light shielding wall to the fourth light shielding wall.

2. The solid-state imaging device according to claim 1, further comprising:
a first color filter that filters light for the first pixel, wherein a center of the first color filter is offset from a center of a photodiode of the first pixel in a direction toward a center of the pixel array unit; and
a second color filter that filters light for the second pixel, wherein a center of the second color filter is offset from a center of a photodiode of the second pixel in the direction toward the center of the pixel array unit, wherein the first light shielding wall and the second light shielding wall are made of a same material.

3. The solid-state imaging device according to claim 1, wherein the first light shielding film covers half of a photodiode of the second pixel.

4. The solid-state imaging device according to claim 1, further comprising:
a second light shielding film in contact with a first end of the fourth light shielding wall, wherein a width of the second light shielding film is larger than a largest width of the fourth light shielding wall.

5. The solid-state imaging device according to claim 4, wherein the width of the second light shielding film is less than the width of the first light shielding film.

6. The solid-state imaging device according to claim 4, wherein the width of the second light shielding film is the same as the width of the first light shielding film.

7. The solid-state imaging device according to claim 4, wherein a portion of the third light shielding wall contacts a portion of the first end of the fourth light shielding wall.

8. The solid-state imaging device according to claim 1, wherein a portion of the first light shielding wall contacts a portion of the first end of the second light shielding wall-.

9. The solid-state imaging device according to claim 1, wherein an inner lens is formed in at least one of the first pixel and the second pixel.

10. The solid-state imaging device according to claim 1, wherein the first pixel, the second pixel, or both include an inner lens and an outer lens.

11. An electronic apparatus, comprising:
a solid-state imaging device including:
a pixel array unit including a plurality of pixels, the plurality of pixels including a first pixel and a second pixel immediately adjacent to a first side of the first pixel;
a first multi-stage light shielding wall provided between the first pixel and the second pixel, the first multi-stage light shielding wall including:
a first light shielding wall extending through a first film; and
a second light shielding wall extending through a second film and offset from the first light shielding wall in a direction toward a periphery of the pixel array unit in a cross sectional view;
a first light shielding film in contact with a first end of the second light shielding wall, wherein a width of the first light shielding film is larger than a largest width of the second light shielding wall;
a third pixel in the plurality of pixels immediately adjacent to a second side of the first pixel opposite to the first side of the first pixel so that the third pixel, the first pixel, and the second pixel are arranged in that order in a row of the pixel array unit; and
a second multi-stage light shielding wall between the first pixel and the third pixel, the second multi-stage light shielding wall including:
  a third light shielding wall extending through the first film; and
  a fourth light shielding wall extending through the second film and offset from the third light shielding wall in the direction toward the periphery of the pixel array unit in the cross sectional view,
wherein, in the cross sectional view, the first film includes a portion that extends uninterrupted from the first light shielding wall to the third light shielding wall, and
wherein, in the cross sectional view, the second film includes a portion that extends uninterrupted from the second light shielding wall to the fourth light shielding wall.

12. The electronic apparatus according to claim 11, wherein the first light shielding wall and the second light shielding wall are made of a same material.

13. The electronic apparatus according to claim 11, wherein the first light shielding film partially covers a photodiode of the second pixel.

14. The electronic apparatus according to claim 11, further comprising:
  a second light shielding film in contact with a first end of the fourth light shielding wall, wherein a width of the second light shielding film is larger than a largest width of the fourth light shielding wall.

15. The electronic apparatus according to claim 14, wherein the width of the second light shielding film is less than the width of the first light shielding film.

16. The electronic apparatus according to claim 14, wherein the width of the second light shielding film is the same as the width of the first light shielding film.

17. The electronic apparatus according to claim 14, wherein a portion of the third light shielding wall contacts a portion of the first end of the fourth light shielding wall.

18. The electronic apparatus according to claim 11, wherein a portion of the first light shielding wall contacts a portion of the first end of the second light shielding wall.

* * * * *